(12) United States Patent
Takahashi

(10) Patent No.: US 11,678,594 B2
(45) Date of Patent: Jun. 13, 2023

(54) SEMICONDUCTOR STORAGE DEVICE

(71) Applicant: Kioxia Corporation, Tokyo (JP)

(72) Inventor: Natsuumi Takahashi, Yokkaichi Mie (JP)

(73) Assignee: KIOXIA CORPORATION, Tokyo (JP)

(*) Notice: Subject to any disclaimer, the term of this patent is extended or adjusted under 35 U.S.C. 154(b) by 34 days.

(21) Appl. No.: 17/191,228

(22) Filed: Mar. 3, 2021

(65) Prior Publication Data
US 2022/0069212 A1 Mar. 3, 2022

(30) Foreign Application Priority Data
Sep. 1, 2020 (JP) .............................. JP2020-146832

(51) Int. Cl.
*H01L 45/00* (2006.01)
*H01L 27/24* (2006.01)

(52) U.S. Cl.
CPC ........... *H10N 70/826* (2023.02); *H10B 63/80* (2023.02); *H10N 70/841* (2023.02); *H10N 70/882* (2023.02)

(58) Field of Classification Search
CPC ................................................... H01L 45/1233
See application file for complete search history.

(56) References Cited

U.S. PATENT DOCUMENTS

| | | | |
|---|---|---|---|
| 9,082,714 B2 | 7/2015 | Koval et al. | |
| 10,050,194 B1* | 8/2018 | Nardi | H01L 45/144 |
| 10,629,809 B2 | 4/2020 | Yamakawa | |
| 10,879,463 B2* | 12/2020 | Tsai | H01L 45/144 |
| 2009/0101883 A1* | 4/2009 | Lai | H01L 45/1675 257/3 |
| 2011/0266511 A1* | 11/2011 | Shen | H01L 45/126 257/3 |
| 2014/0151638 A1* | 6/2014 | Chang | B82Y 40/00 257/27 |
| 2014/0319442 A1 | 10/2014 | Hayashi | |
| 2020/0287133 A1* | 9/2020 | Sarkar | H01L 45/1286 |
| 2021/0066582 A1* | 3/2021 | Lee | H01L 45/144 |

FOREIGN PATENT DOCUMENTS

| | | |
|---|---|---|
| JP | 2014-530501 A | 11/2014 |
| JP | 2020-024965 A | 2/2020 |

OTHER PUBLICATIONS

S.W. Fong et al., "Thermal conductivity measurement of amorphous dielectric multilayers for phase-change memory power reduction," Journal of Applied Physics, 120, 015103 (2016_, pgs. (9 total).

* cited by examiner

*Primary Examiner* — Mounir S Amer
(74) *Attorney, Agent, or Firm* — Foley & Lardner LLP

(57) ABSTRACT

According to one embodiment, the semiconductor storage device includes a first wiring extending in a first direction, a second wiring extending in a second direction intersecting the first direction, a first semiconductor device extending in a third direction intersecting the first direction and the second direction, connected to the first wiring and the second wiring, and including a first selector layer and a first variable resistance layer, a first insulator extending in the second and third directions and adjacent to the first semiconductor device in the first direction, and a second insulator extending in the second and third directions and including an air gap disposed between the first semiconductor device and the first insulator.

12 Claims, 23 Drawing Sheets

FIG. 6
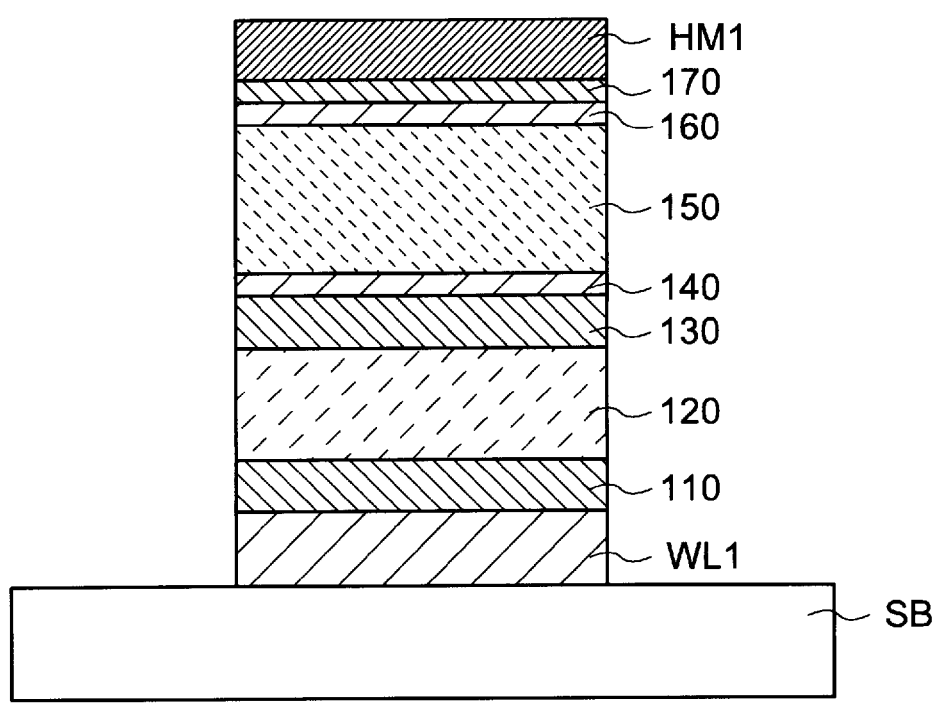
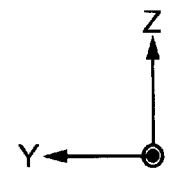

FIG. 7
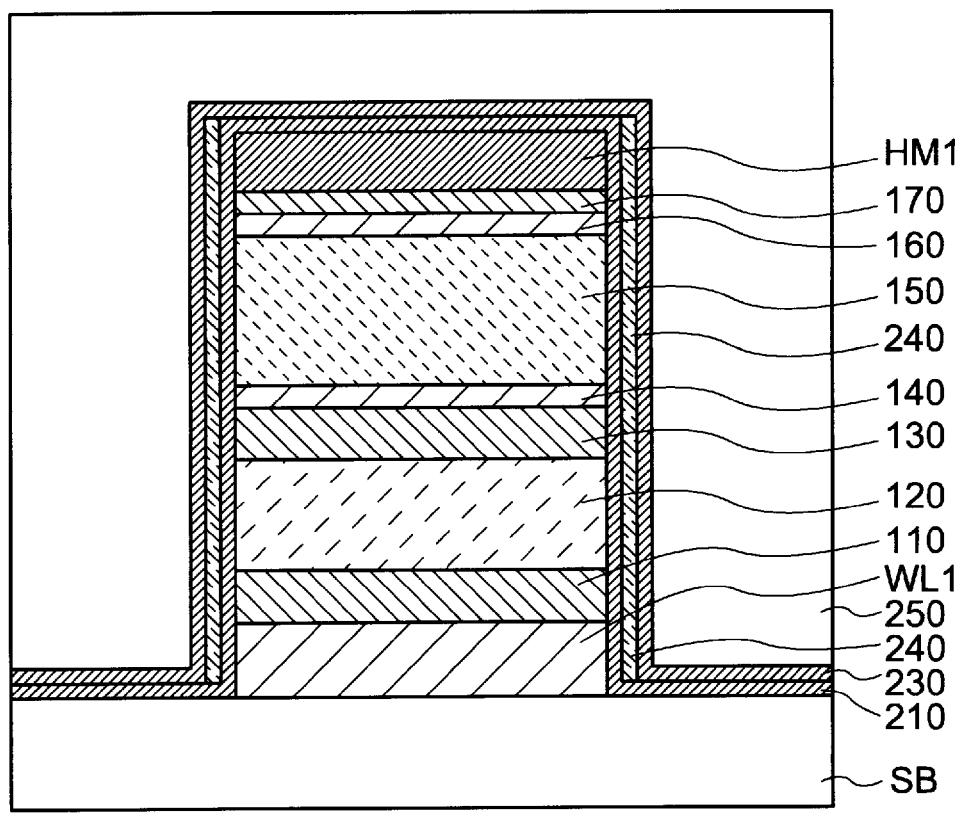
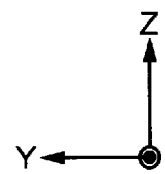

FIG. 8
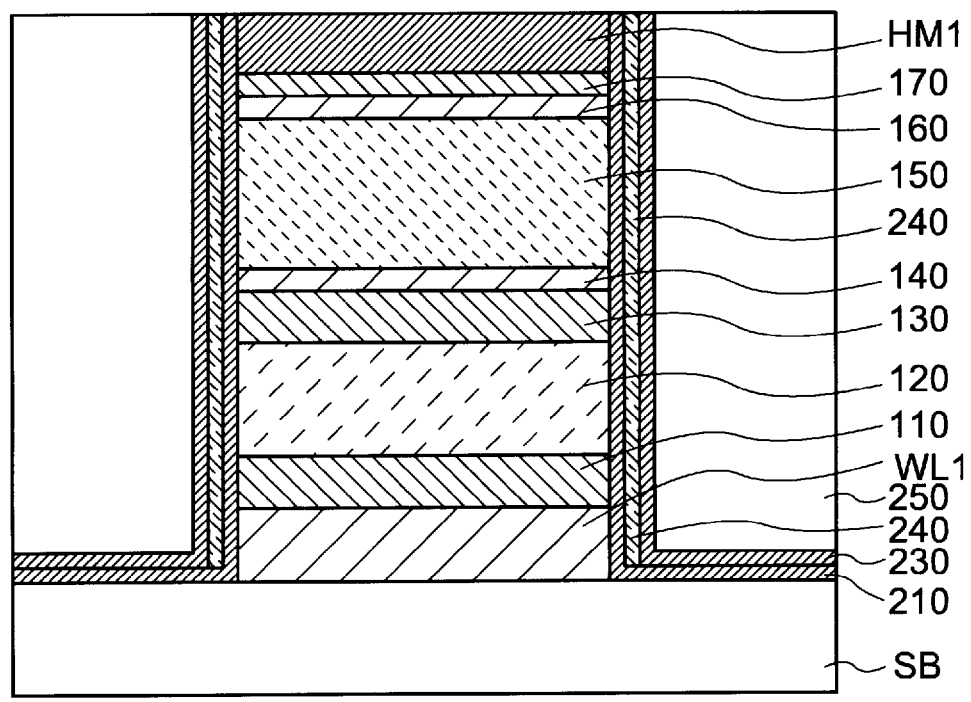
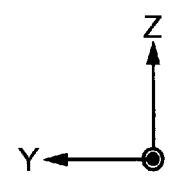

FIG. 10
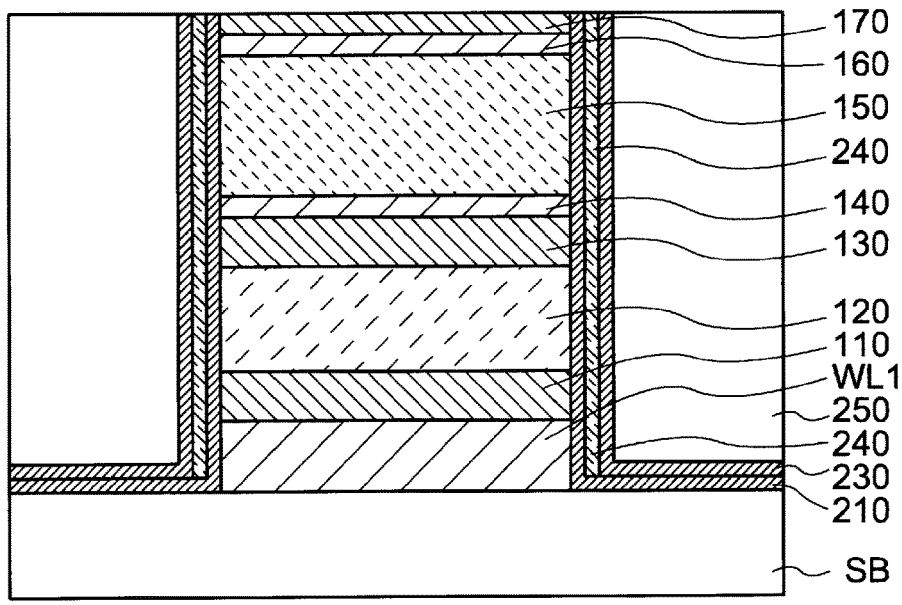
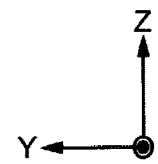
FIG. 11
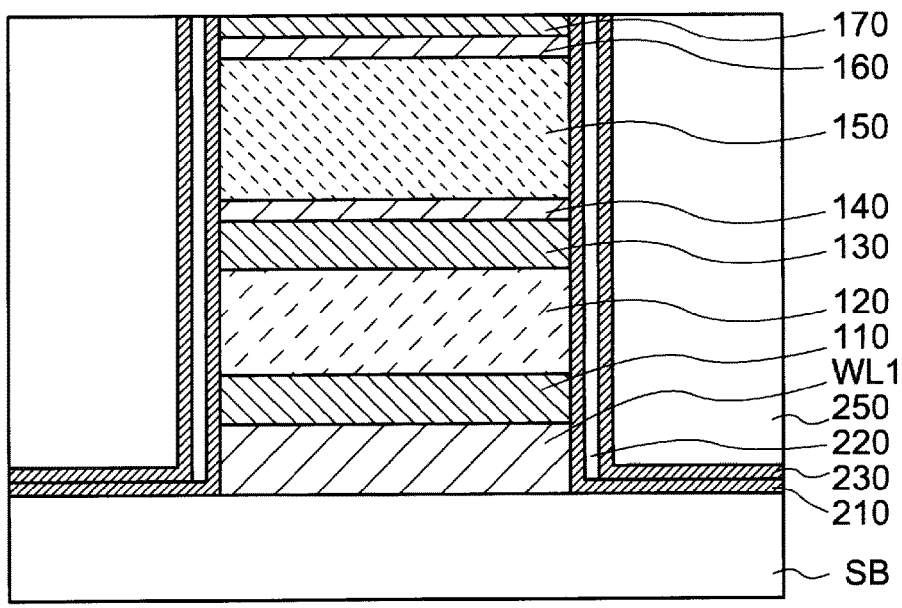
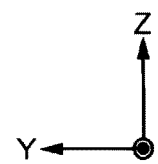

FIG. 13
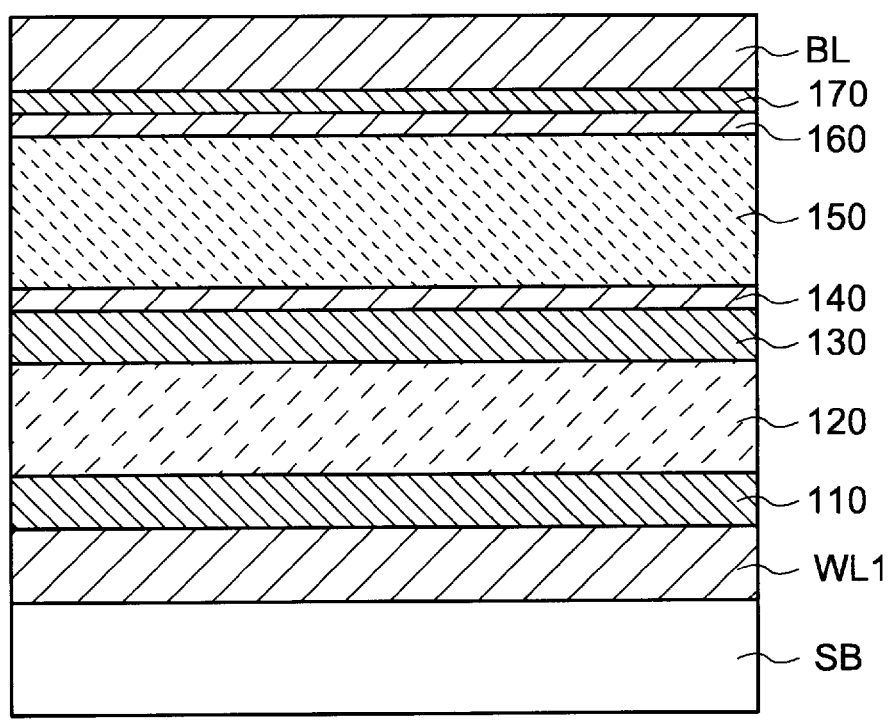
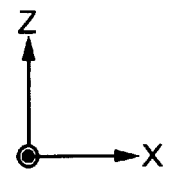

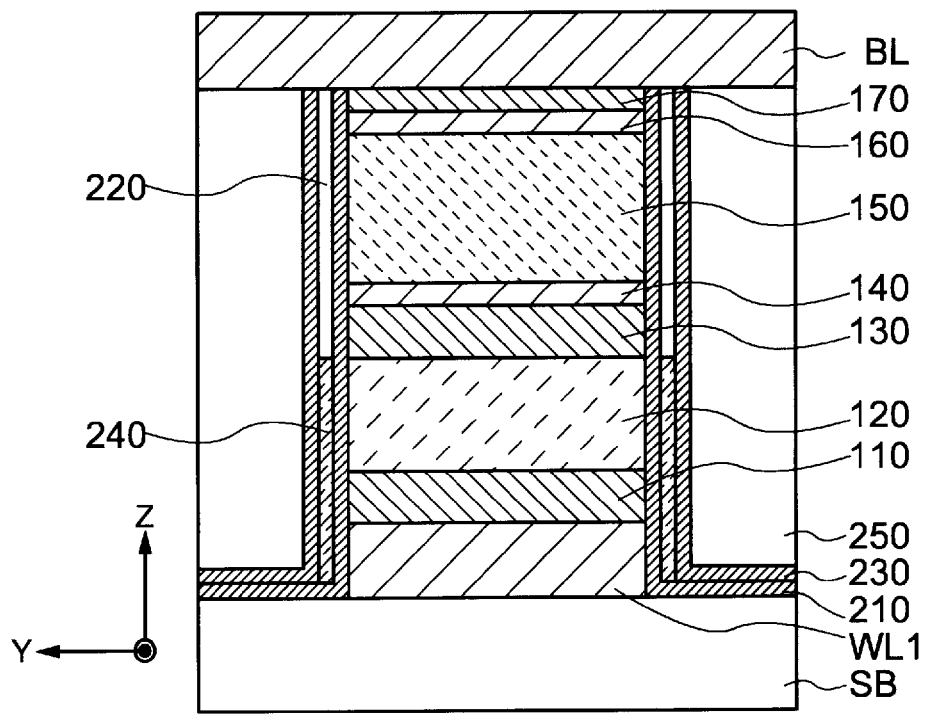
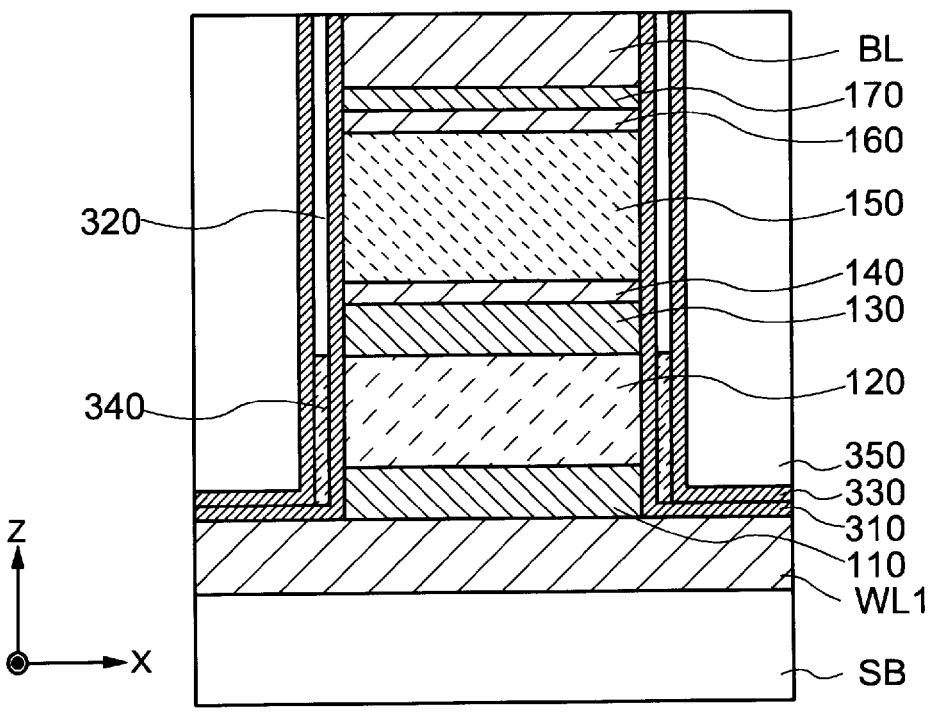

FIG. 23A
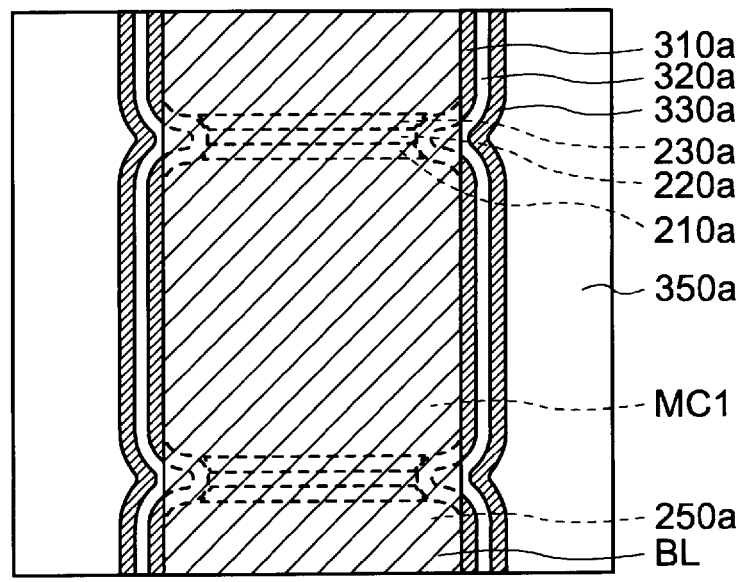
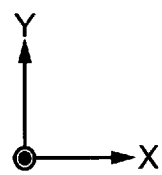
FIG. 23B
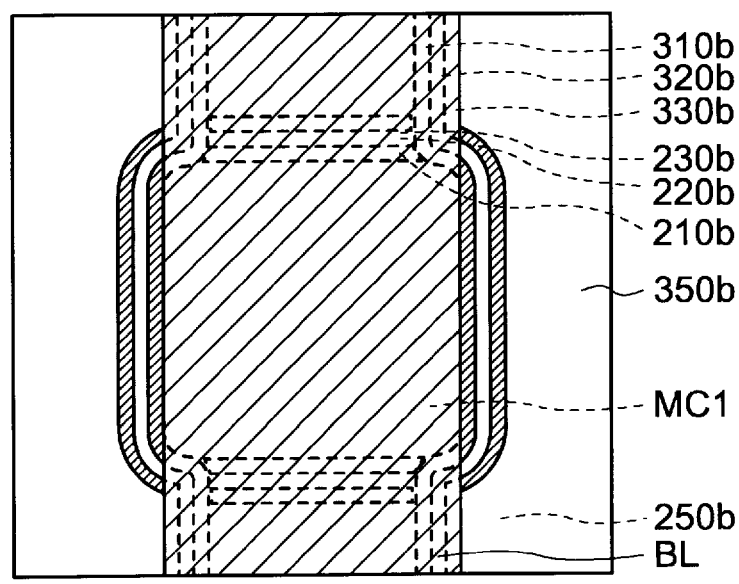
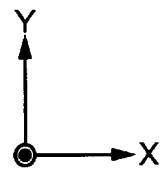

SEMICONDUCTOR STORAGE DEVICE

CROSS-REFERENCE TO RELATED APPLICATION

This application is based upon and claims the benefit of priority from Japanese Patent Application No. 2020-146832, filed on Sep. 1, 2020, the entire contents of which are incorporated herein by reference.

FIELD

Embodiments described herein relate generally to a semiconductor storage device.

BACKGROUND

A semiconductor storage device can includes resistance-change type semiconductor memory elements such as a resistive random access memory (ReRAM) element, an alloy-type phase change memory (PCM) element, an interfacial phase change memory (iPCM) element, and a conduction bridge RAM (CBRAM) element integrated on a semiconductor substrate. The resistance-change type semiconductor memory element generally uses a phase-change film and applies heat to change the resistance value of the phase-change film, thereby functioning as a non-volatile memory element to store information.

DESCRIPTION OF THE DRAWINGS

FIG. 6 is a cross-sectional view showing the method for manufacturing the memory cell of the semiconductor storage device;

FIG. 7 is a cross-sectional view showing the method for manufacturing the memory cell of the semiconductor storage device;

FIG. 8 is a cross-sectional view showing the method for manufacturing the memory cell of the semiconductor storage device;

FIG. 10 is a cross-sectional view showing the method for manufacturing the memory cell of the semiconductor storage device;

FIG. 11 is a cross-sectional view showing the method for manufacturing the memory cell of the semiconductor storage device;

FIG. 13 is a cross-sectional view showing the method for manufacturing the memory cell of the semiconductor storage device;

FIG. 19A is a cross-sectional view showing the configuration of the memory cell of the semiconductor storage device;

FIG. 19B is a cross-sectional view showing the configuration of the memory cell of the semiconductor storage device;

FIG. 23A is a top view showing the configuration of the memory cell of the semiconductor storage device; and FIG. 23B is a top view showing the configuration of the memory cell of the semiconductor storage device.

DETAILED DESCRIPTION

Figure 1:
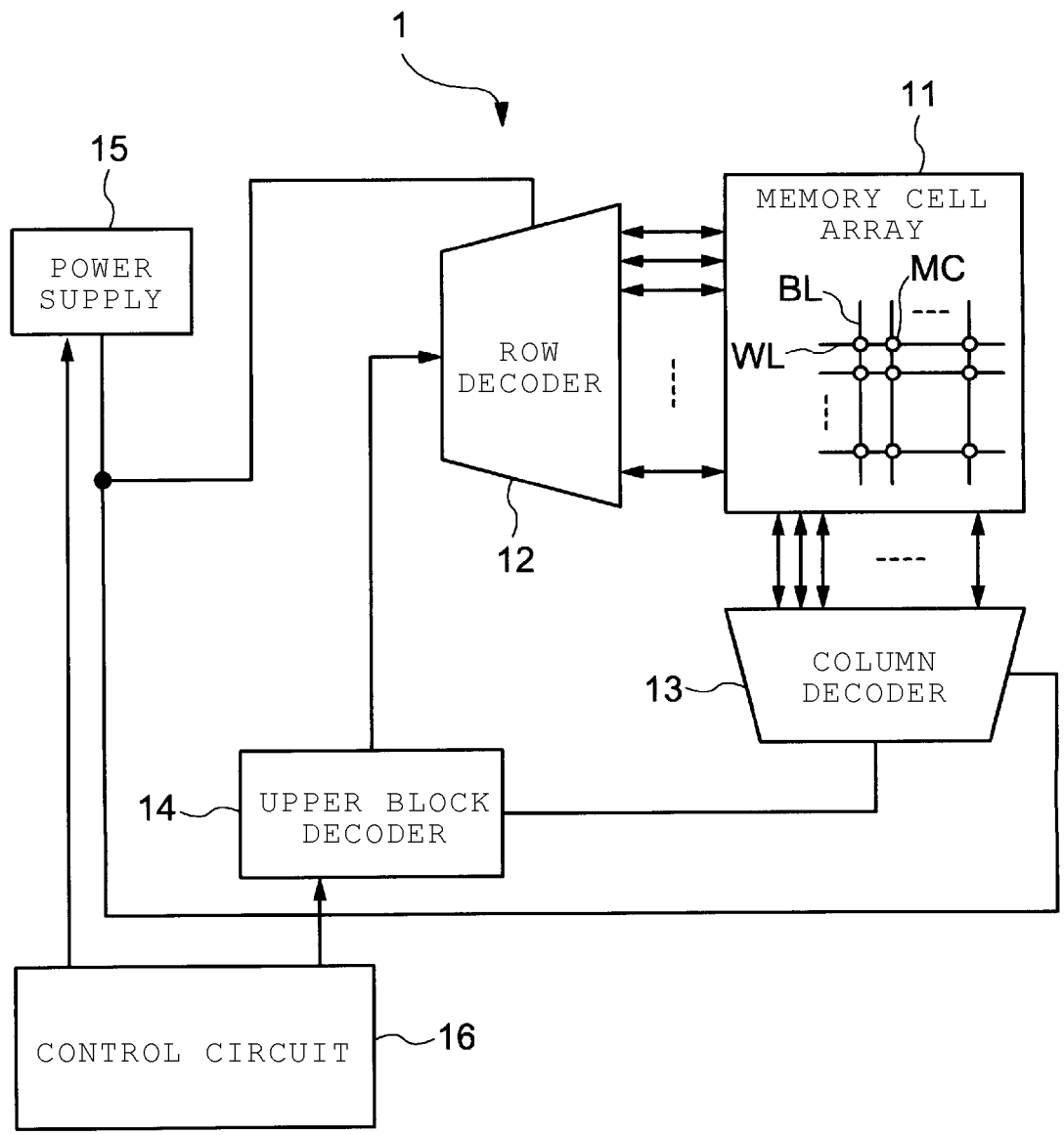
FIG. 1 is a block diagram of a semiconductor storage device according to an embodiment.

An object of the present disclosure is to improve the heat retention of a semiconductor memory element, or device.

In general, according to one embodiment, the semiconductor storage device includes a first wiring extending in a first direction, a second wiring extending in a second direction intersecting the first direction, a first semiconductor device extending in a third direction intersecting the first direction and the second direction, connected to the first wiring and the second wiring, and including a first selector layer and a first variable resistance layer, a first insulator extending in the second and third directions, and adjacent to the first semiconductor device in the first direction, and a second insulator extending in the second and third directions and including an air gap disposed between the first semiconductor device and the first insulator.

Hereinafter, the semiconductor storage device according to the present embodiment will be described in detail with reference to the drawings. In the following description, components having substantially the same functions and configurations are denoted by the same reference numerals and duplicate descriptions will be given only when necessary. The embodiments shown below exemplify devices and methods for embodying the technical idea and the technical idea of the embodiment is not specified by the materials, shapes, structures, arrangements, or the like of the components as follows. The technical idea of the embodiment may be modified in various ways within the scope of the claims.

In order to clarify the description, the drawings may schematically represent the width, thickness, shape, or the like of each part as compared with the actual embodiment and this is merely an example and does not limit the interpretation of the present disclosure. In the specification and each drawing, elements having the same functions as those described with respect to the drawings already described may be denoted by the same reference numerals and the duplicate description may be omitted.

A plurality of films formed by the same process have the same layer structure and are composed of the same material. In the present specification, even when the plurality of films have different functions or roles, the plurality of films thus formed by the same process are treated as films existing in the same layer.

First Embodiment

[Configuration of Semiconductor Storage Device]

The configuration of the semiconductor storage device according to the present embodiment will be described. In the drawings referred to below, the X direction corresponds to the extending direction of the word line, the Y direction corresponds to the extending direction of the bit line, and the Z direction corresponds to the direction perpendicular to the surface of the semiconductor substrate. In the following drawings, components such as an insulator layer (interlayer insulating film), wiring, and contacts are appropriately omitted in order to make the drawings easier to see.

FIG. 1 is a block diagram of a semiconductor storage device according to the present embodiment. A semiconductor storage device 1 according to the present embodiment includes a memory cell array 11, a row decoder 12 and a column decoder 13 that select a desired memory cell MC from the memory cell array 11, an upper block decoder 14 that provides a row address and a column address to the decoders 12 and 13, a power supply that supplies electric power to each part of the semiconductor storage device 1, and a control circuit 16 that controls the above.

Each memory cell array 11 includes a plurality of memory cells MC for storing 1-bit or a plurality of bits of data. The memory cell array 11 is configured to be accessible (data erase/write/read) by the desired memory cell MC by applying a predetermined voltage to the desired bit line BL and word line WL selected by the row decoder 12 and the column decoder 13.

Figure 2:
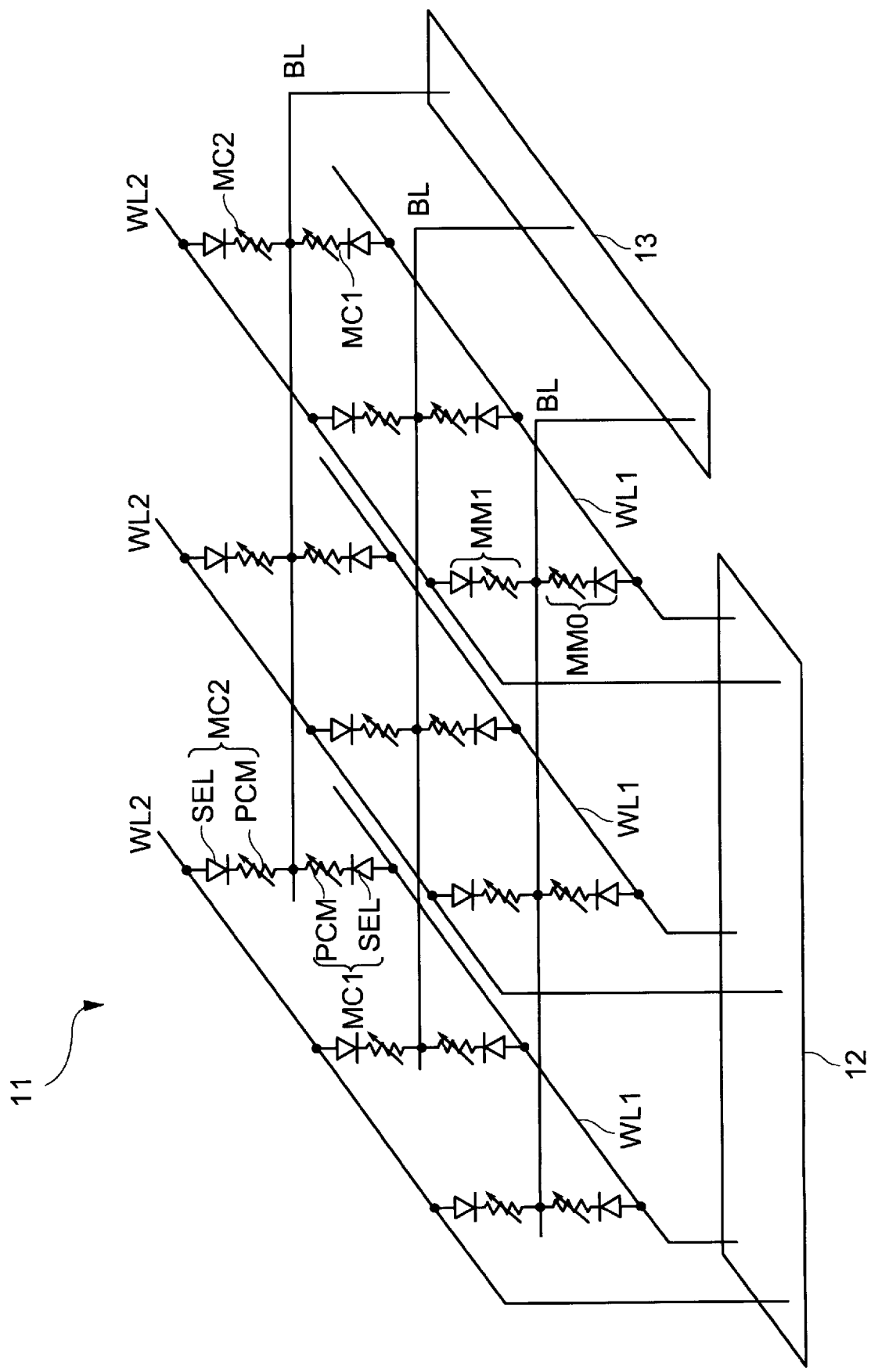
FIG. 2 is a circuit diagram showing a configuration of a memory cell array of the semiconductor storage device.

FIG. 2 is an equivalent circuit diagram showing a partial configuration of the memory cell array 11. The memory cell array 11 includes a plurality of bit lines BL, a plurality of word lines WL1 and WL2, and a plurality of memory cells MC1 and MC2 connected to the bit lines BL and the word lines WL1 and WL2. The memory cells MC1 and MC2 are connected to the row decoder 12 via the word lines WL1 and WL2 and are connected to the column decoder 13 via the bit lines BL. The memory cells MC1 and MC2 each store, for example, 1-bit of data. The plurality of memory cells MC1 and MC2 connected to the common word lines WL1 and WL2 store, for example, one page of data.

The memory cells MC1 and MC2 each include a phase-change film PCM and a selector SEL connected in series. The phase-change film PCM can present two states, e.g., a low resistance crystal state and a high resistance amorphous state, depending on the current pattern (heating pattern). As such, the phase-change PCM can function as a variable resistance element. By associating the two states of resistance values with the information of "0" and "1," respectively, the phase-change film PCM can function as a memory cell. The selector SEL of each of the memory cells MC1 and MC2 can function as a rectifying element. Therefore, almost no current flows through the other word lines WL1 and WL2 besides the selected word lines WL1 and WL2.

In the following discussions, a configuration including a plurality of bit lines BL, a plurality of word lines WL1, and a plurality of memory cells MC1 corresponding to a first layer of the memory cell array 11 will be referred to as a memory mat MM0. Similarly, a configuration including a plurality of bit lines BL, a plurality of word lines WL2, and a plurality of memory cells MC2 corresponding to a second layer of the memory cell array 11 is referred to as a memory mat MM1.

Figure 3:
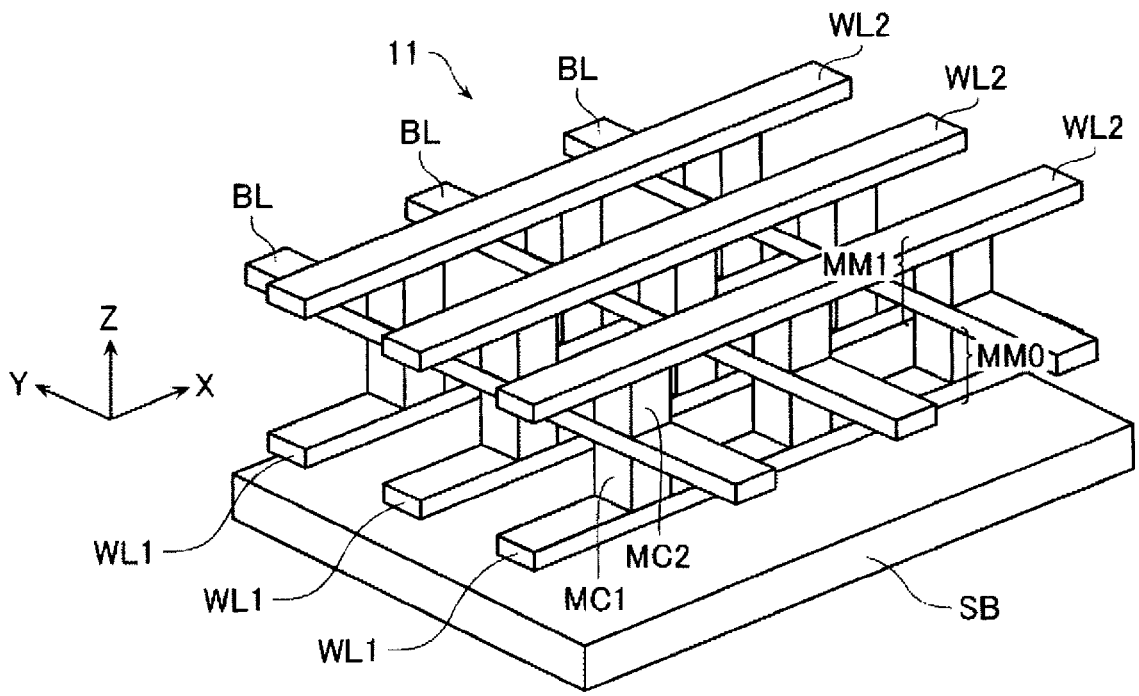
FIG. 3 is a perspective view showing a configuration of the memory cell array.

FIG. 3 is a schematic perspective view showing a configuration of a part of the memory cell array 11. The memory cell array 11 is a so-called cross-point type memory cell array in the present example. That is, above a semiconductor substrate SB, a plurality of word lines WL1 are arranged side by side at predetermined intervals in the Y direction parallel to the upper surface of the semiconductor substrate SB and to extend parallel to the upper surface of the semiconductor substrate SB and parallel to the X direction intersecting the Y direction. Above the plurality of word lines WL1, a plurality of bit lines BL are arranged side by side at predetermined intervals in the X direction and to extend parallel to the Y direction. Above the plurality of bit lines BL, a plurality of word lines WL2 are arranged side by side at predetermined intervals in the Y direction and to extend parallel to the X direction. The memory cell MC1 is provided at each intersection of the plurality of word lines WL1 and the plurality of bit lines BL. Similarly, the memory cell MC2 is provided at each intersection of the plurality of bit lines BL and the plurality of word lines WL2. The memory cells MC1 and MC2 are prismatic in the present embodiment but may be cylindrical.

[Configuration of Semiconductor Element]

Figure 4A:
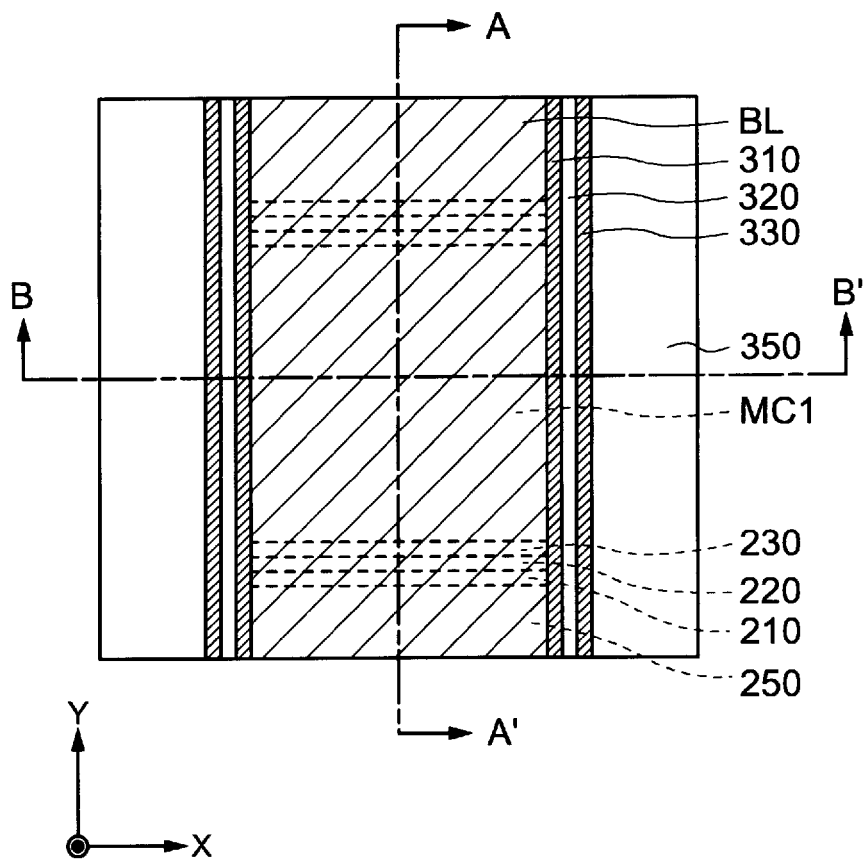
FIG. 4A is a top view showing a configuration of a memory cell of the semiconductor storage device.
Figure 4B:
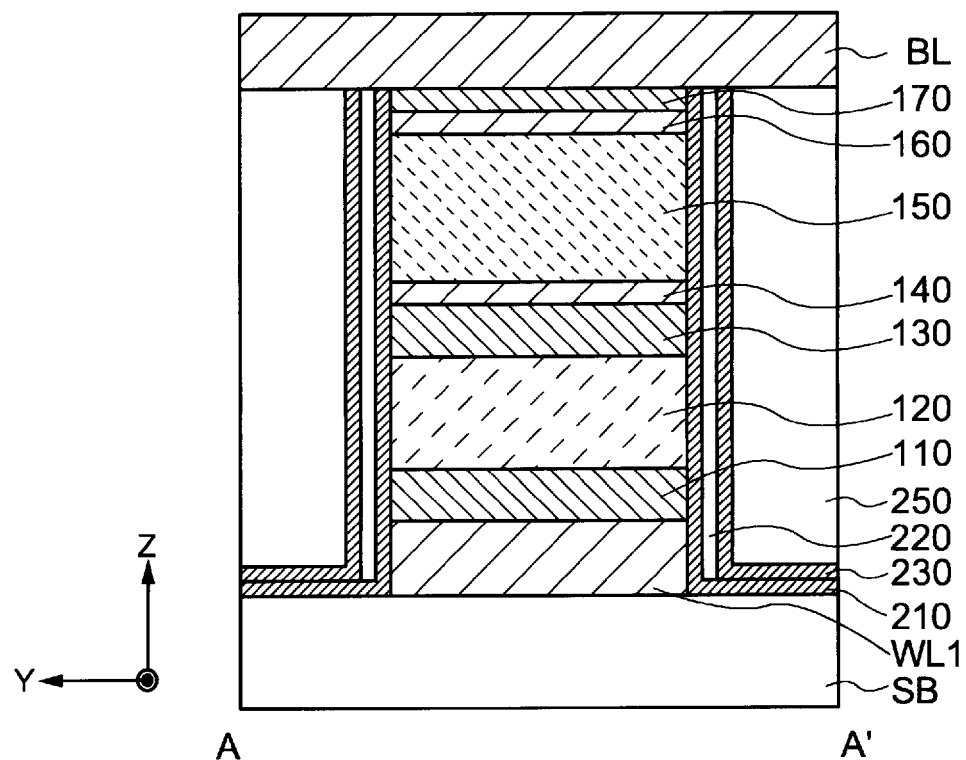
FIG. 4B is a cross-sectional view showing the configuration of the memory cell of the semiconductor storage device.
Figure 4C:
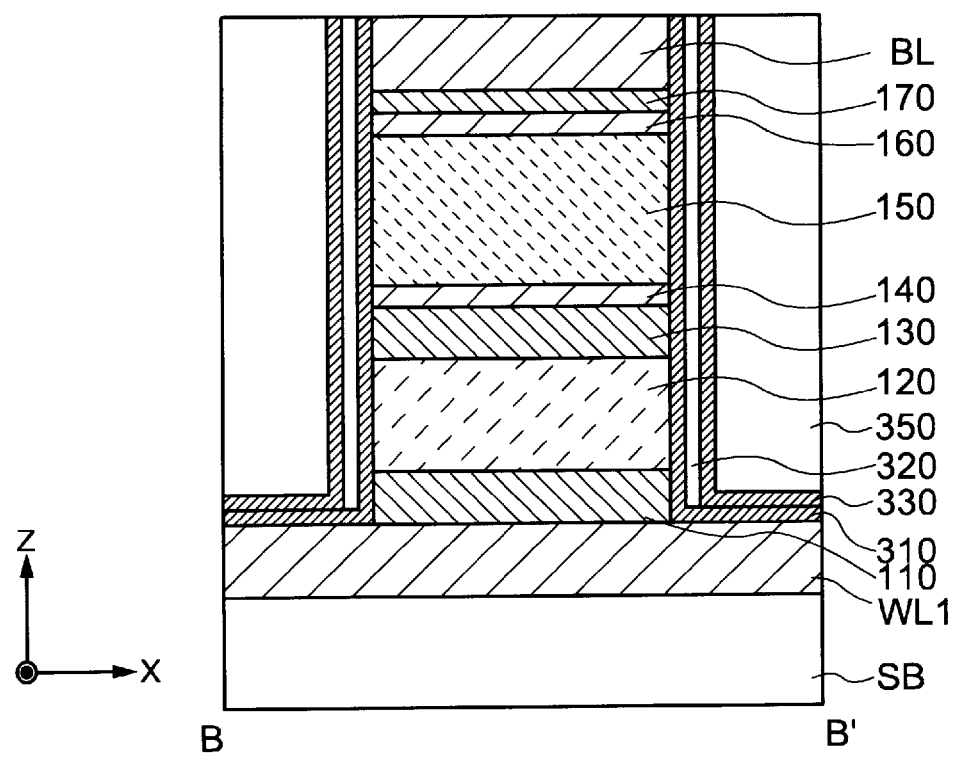
FIG. 4C is a cross-sectional view showing the configuration of the memory cell of the semiconductor storage device.

FIGS. 4A to 4C are diagrams showing a configuration of a memory cell (semiconductor element) MC1 of the semiconductor storage device 1. FIG. 4A shows an example of a top view of the memory cell MC1 in the XY plane. FIG. 4B shows an example of a cross-sectional view of the memory cell MC1 in the YZ plane along the A-A' line shown in FIG. 4A. FIG. 4C shows an example of a cross-sectional view of the memory cell MC1 in the XZ plane along the B-B' line shown in FIG. 4A. In FIGS. 4A to 4C, one memory cell MC1 is shown but the memory cell MC1 is connected to the memory cells MC1 having the same configurations in the XY plane to form the memory mat MM0. Similarly, in the Z direction, the memory cell MC1 is connected to the memory cells MC2 having the same configurations by sharing the bit line BL to form the memory mat MM1.

As shown in FIGS. 4A to 4C, the memory cell MC1 includes the word line (first wiring) WL1 extending in the X direction (first direction) disposed on the semiconductor substrate SB side, the bit line (second wiring) BL extending in the Y direction (second direction) disposed opposite to the semiconductor substrate SB with respect to the word line WL1, the memory cell (semiconductor element) MC1 disposed between the word line WL1 and the bit line BL, an insulator disposed between the side surfaces of the plurality of memory cells MC1, a heat-insulating layer disposed between the insulator and the memory cell MC1, and an insulating layer surrounding the heat-insulating layer.

The memory cell MC1 includes a lower electrode layer 110, a selector layer 120, an intermediate electrode layer 130, a barrier metal layer 140, a variable resistance layer 150 (phase-change film PCM), a barrier metal layer 160, and an upper electrode layer 170, which are stacked in this order from the word line WL1 side toward the bit line BL side in the Z direction (third direction) intersecting the X direction and the Y direction. The word line WL1, the bit line BL, the lower electrode layer 110, the intermediate electrode layer 130, and the upper electrode layer 170 may be made of a conductive material such as tungsten (W), titanium (Ti), or poly-Si. The barrier metal layers 140 and 160 may be made of a conductive material such as titanium nitride (TiN), tantalum (Ta), or tantalum nitride (TaN). The selector layer 120 may be composed of a non-ohmic element such as a pin diode made of a p-type semiconductor layer, an intrinsic semiconductor layer, and an n-type semiconductor layer, for example. The variable resistance layer 150 may be made of, for example, a chalcogenide material such as Ge—Sb—Te system (GST system) containing germanium (Ge), antimony (Sb), and tellurium (Te). The distance between adjacent memory cells MC1 may be, for example, about 14 nm in the X or Y direction.

The insulator is disposed between the adjacent memory cells MC1. The insulator includes a first insulator 350 adjacent to the memory cell MC1 in the X direction and a third insulator 250 adjacent to the memory cell MC1 in the Y direction. The first insulator 350 extends in the Y direction and is adjacent, in the X direction, to a plurality of memory cells MC1 arranged in the Y direction. The first insulator 350 extends in the Z direction from the same position as the lower electrode layer 110 to the same position as the bit line BL. The third insulator 250 has a width substantially the same as that of the memory cell MC1 in the X direction and is adjacent to the memory cell MC1 in the Y direction. The third insulator 250 extends in the Z direction from the same position as the word line WL1 to the same position as the upper electrode layer 170. Here, when the first insulator 350 and the third insulator 250 are not distinguished, the first insulator 350 and the third insulator 250 are collectively referred to as the insulator. The insulator may be composed of, for example, an insulator such as a carbon-added silicon oxide film (SiOC film). The thickness of the first insulator 350 in the X direction and the thickness of the third insulator 250 in the Y direction may be, for example, about 6 nm.

The heat-insulating layer is disposed between the memory cell MC1 and the insulator. The heat-insulating layer includes a second insulator 320 disposed between the memory cell MC1 and the first insulator 350, and a fourth insulator 220 disposed between the memory cell MC1 and the third insulator 250. The second insulator 320 extends in the Y direction and is adjacent, in the X direction, to a plurality of memory cells MC1 arranged in the Y direction. The second insulator 320 extends in the Z direction from the same position as the lower electrode layer 110 to the same position as the bit line BL. The fourth insulator 220 has a width substantially the same as that of the memory cell MC1 in the X direction and is adjacent to the memory cell MC1 in the Y direction. The fourth insulator 220 extends in the Z direction from the same position as the word line WL to the same position as the upper electrode layer 170.

That is, the second insulator 320 and the fourth insulator 220 surround the side surface of the memory cell MC1. Here, when the second insulator 320 and the fourth insulator 220 are not distinguished, the second insulator 320 and the fourth insulator 220 are collectively referred to as the heat-insulating layer. In the present embodiment, the second insulator 320 and the fourth insulator 220 are an air gap, that is, an air layer. The thickness of the second insulator 320 in the X direction and the thickness of the fourth insulator 220 in the Y direction may be, for example, about 2 nm.

In the semiconductor storage device 1 according to the present embodiment, the thermal resistance of the memory cell MC1 can be improved and the heat retention can be improved by arranging the heat-insulating layer which is an air layer to surround the side surface of the memory cell MC1. By arranging the heat-insulating layer which is an air layer to surround the side surface of the memory cell MC1, the withstand voltage of the memory cell MC1 can be improved.

The insulating layer surrounds the heat-insulating layer. The insulating layer includes a first insulating layer 310, a second insulating layer 330, a third insulating layer 210, and a fourth insulating layer 230. The first insulating layer 310 is disposed between the memory cell MC1 and the second insulator 320. The second insulating layer 330 is disposed between the first insulator 350 and the second insulator 320. The first insulating layer 310 extends in the Y direction and is in contact with the second insulator 320. The first insulating layer 310 is disposed on the side opposite to the second insulator 320 in contact with a plurality of memory cells MC1, fourth insulators 220, and third insulators 250, which are arranged in the Y direction. The first insulating layer 310 is disposed on the side opposite to the second insulator 320 in contact with the third insulating layer 210 and the fourth insulating layer 230, which will be further described later. The second insulating layer 330 extends in the Y direction and is in contact with the second insulator 320. The second insulating layer 330 is in contact with the first insulator 350 on the side opposite to the second insulator 320. The first insulating layer 310 and the second insulating layer 330 extend in the Z direction from the same position as the lower electrode layer 110 to the same position as the bit line BL. The first insulating layer 310 is in contact with the upper surface of the word line WL1 in a region where the memory cell MC1 is not provided. The second insulating layer 330 is in contact with the first insulating layer 310 in a region on the word line WL1 where the memory cell MC1 is not provided. That is, the bottom surface and the side surface of the second insulator 320 are surrounded by the first insulating layer 310 and the second insulating layer 330. The bottom surface and the side surface of the first insulator 350 are surrounded by the second insulation layer 330. The first insulating layer 310 and the second insulating layer 330 may be made of, for example, silicon nitride (SiN) or silicon oxide (SiO). The first insulating layer 310 and the second insulating layer 330 are preferably made of the same material. The thickness of the first insulating layer 310 and the second insulating layer 330 in the X direction may be, for example, about 1 nm.

The third insulating layer 210 is disposed between the memory cell MC1 and the fourth insulator 220. The fourth insulating layer 230 is disposed between the third insulator 250 and the fourth insulator 220. The third insulating layer 210 has a width substantially the same as that of the memory cell MC1 in the X direction and is in contact with the memory cell MC1 and the fourth insulator 220. The fourth insulating layer 230 has a width substantially the same as that of the memory cell MC1 in the X direction and is in contact with the third insulator 250 and the fourth insulator 220. The third insulating layer 210 and the fourth insulating layer 230 are connected to the first insulating layer 310. The third insulating layer 210 and the fourth insulating layer 230 extend in the Z direction from the same position as the word line WL to the same position as the upper electrode layer 170. The third insulating layer 210 is in contact with the upper surface of the semiconductor substrate SB in a region where the memory cell MC1 is not provided. The fourth insulating layer 230 is in contact with the third insulating layer 210 in a region on the semiconductor substrate SB where the memory cell MC1 is not provided. That is, the side surface of the memory cell MC1 is surrounded by the first insulating layer 310 and the third insulating layer 210. The bottom surface and the side surface of the third insulator 250 are surrounded by the first insulating layer 310 and the fourth insulating layer 230. The bottom surface and the side surface of the fourth insulator 220 are surrounded by the first insulating layer 310, the third insulating layer 210, and the fourth insulating layer 230. The third insulating layer 210 and the fourth insulating layer 230 may be made of, for example, silicon nitride (SiN) or silicon oxide (SiO). The third insulating layer 210 and the fourth insulating layer 230 are preferably made of the same material. The third insulating layer 210 and the fourth insulating layer 230 are preferably made of the same material as the first insulating layer 310 and the second insulating layer 330. The thickness of the third insulating layer 210 and the fourth insulating layer 230 in the Y direction may be, for example, about 1 nm.

In the semiconductor storage device 1 according to the present embodiment, the variable resistance layer 150 enter an amorphous state (high resistance, reset state) by heating above the melting temperature and cooling rapidly. The variable resistance layer 150 enter a crystallization state (low resistance, set state) by heating to a temperature lower than the melting temperature and higher than the crystallization temperature and cooling slowly. As described above, since the variable resistance layer 150 repeats the reset and set operation by melting and solidifying by heating and cooling, the temperature control is greatly related to the performance and reliability of the semiconductor storage device. In the semiconductor storage device 1 according to the present embodiment, the heat retention of the memory cell MC1 can be improved by arranging the heat-insulating layer sandwiched between the insulating layers in contact with the side surface of the memory cell MC1. By improving the heat retention of the memory cell MC1, the reset current can be reduced and the power consumption can be reduced. By improving the heat retention of the memory cell MC1, heat conduction to the adjacent memory cell MC1 can be reduced and malfunction can be reduced.

[Method for Manufacturing Semiconductor Storage Device]

Figure 5:
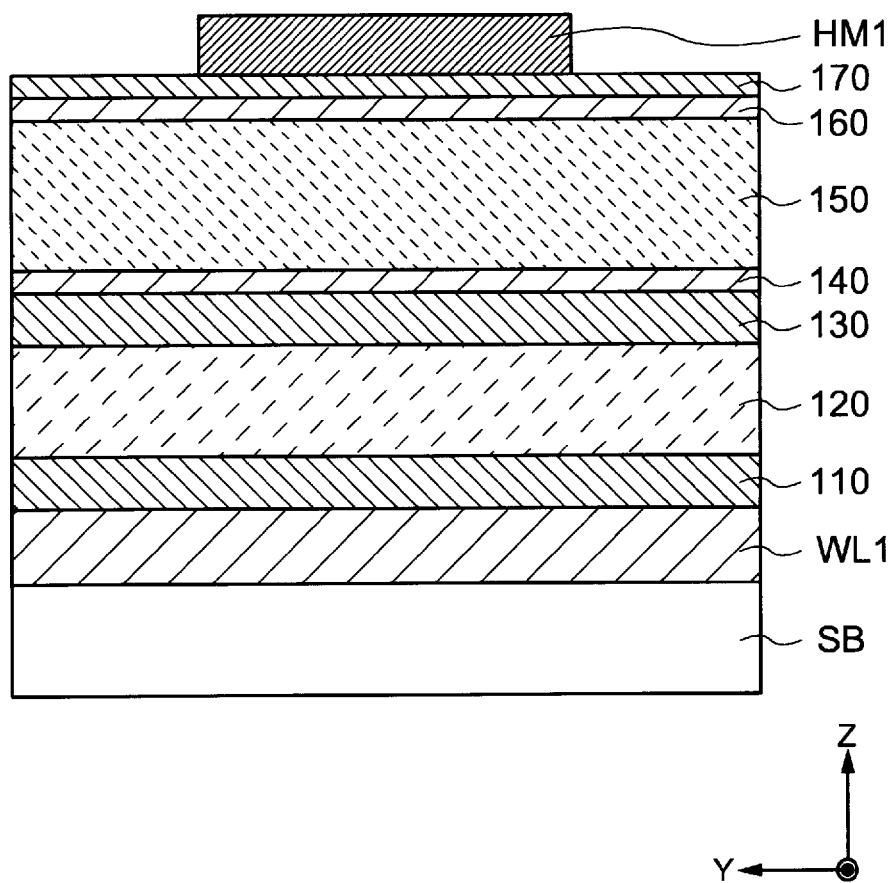
FIG. 5 is a cross-sectional view showing a method for manufacturing the memory cell of the semiconductor storage device.

Next, a method for manufacturing a semiconductor storage device according to the present embodiment will be described with reference to FIGS. 5 to 18. FIG. 5 is a cross-sectional view of the YZ plane showing a step of forming a stacked structure in the method for manufacturing a semiconductor storage device according to the present embodiment. As shown in FIG. 5, a stacked structure including the word line WL1, the lower electrode layer 110, the selector layer 120, the intermediate electrode layer 130, the barrier metal layer 140, the variable resistance layer 150, the barrier metal layer 160, and the upper electrode layer 170 is formed above the semiconductor substrate SB. Each layer is sequentially formed by, for example, a method such as atomic layer deposition (ALD) or chemical vapor deposition (CVD). A hard mask HM1 is formed on the upper electrode layer 170 by lithography.

FIG. 6 is a cross-sectional view of the YZ plane showing a step of dividing the stacked structure (1st cut) in the method for manufacturing a semiconductor storage device according to the present embodiment. As shown in FIG. 6, for example, a part of the stacked structure is removed from the upper electrode layer 170 to the word line WL1 in the Z direction by anisotropic etching such as reactive ion etching (RIE). The stacked structure is divided in the Y direction by selectively etching with a line-shaped hard mask HM1 extending in the X direction. In the region where the stacked structure is removed, a part of the semiconductor substrate SB is exposed.

FIG. 7 is a cross-sectional view of the YZ plane showing a step of forming an insulating layer and a heat-insulating layer in the method for manufacturing a semiconductor storage device according to the present embodiment. As shown in FIG. 7, first, the third insulating layer 210 is formed to cover the stacked structure and the semiconductor substrate SB. Next, a second sacrifice layer 240 is formed to be in contact with the third insulating layer 210. Subsequently, the second sacrifice layer 240 on the stacked structure and on the semiconductor substrate SB is removed by anisotropic etching such as RIE to expose the upper surface of the third insulating layer 210. Next, the fourth insulating layer 230 is formed to be in contact with the second sacrifice layer 240 and the third insulating layer 210. By such forming method, the second sacrifice layer 240 is enclosed by the third insulating layer 210 and the fourth insulating layer 230 and is disposed on the side surface of the stacked structure. Here, the second sacrifice layer 240, the third insulating layer 210, and the fourth insulating layer 230 may be formed by, for example, CVD or the like. The third insulating layer 210 and the fourth insulating layer 230 may be a silicon nitride (SiN) film and the second sacrifice layer 240 may be an amorphous silicon film. The third insulating layer 210 and the fourth insulating layer 230 may be a silicon oxide (SiO) film and the second sacrifice layer 240 may be a silicon nitride (SiN) film. The third insulating layer 210 and the fourth insulating layer 230 only needs to be a combination of materials having a selective ratio with the second sacrifice layer 240 in the step of etching the second sacrifice layer 240, which will be described later. The third insulator 250 is formed to embed each of the stacked structures divided by etching.

FIG. 8 is a cross-sectional view of the YZ plane showing a step of removing the third insulator 250, the third insulating layer 210, and the fourth insulating layer 230 on the stacked structure in the method for manufacturing a semiconductor storage device according to the present embodiment. As shown in FIG. 8, the third insulating layer 250, the third insulating layer 210, and the fourth insulating layer 230 are removed by chemical mechanical polishing (CMP) or the like so that the hard mask HM1 on the stacked structure is exposed. As a result, the upper surfaces of the third insulating layer 210, the second sacrifice layer 240, and the fourth insulating layer 230 that surround the side surface of the stacked structure are exposed.

Figure 9:
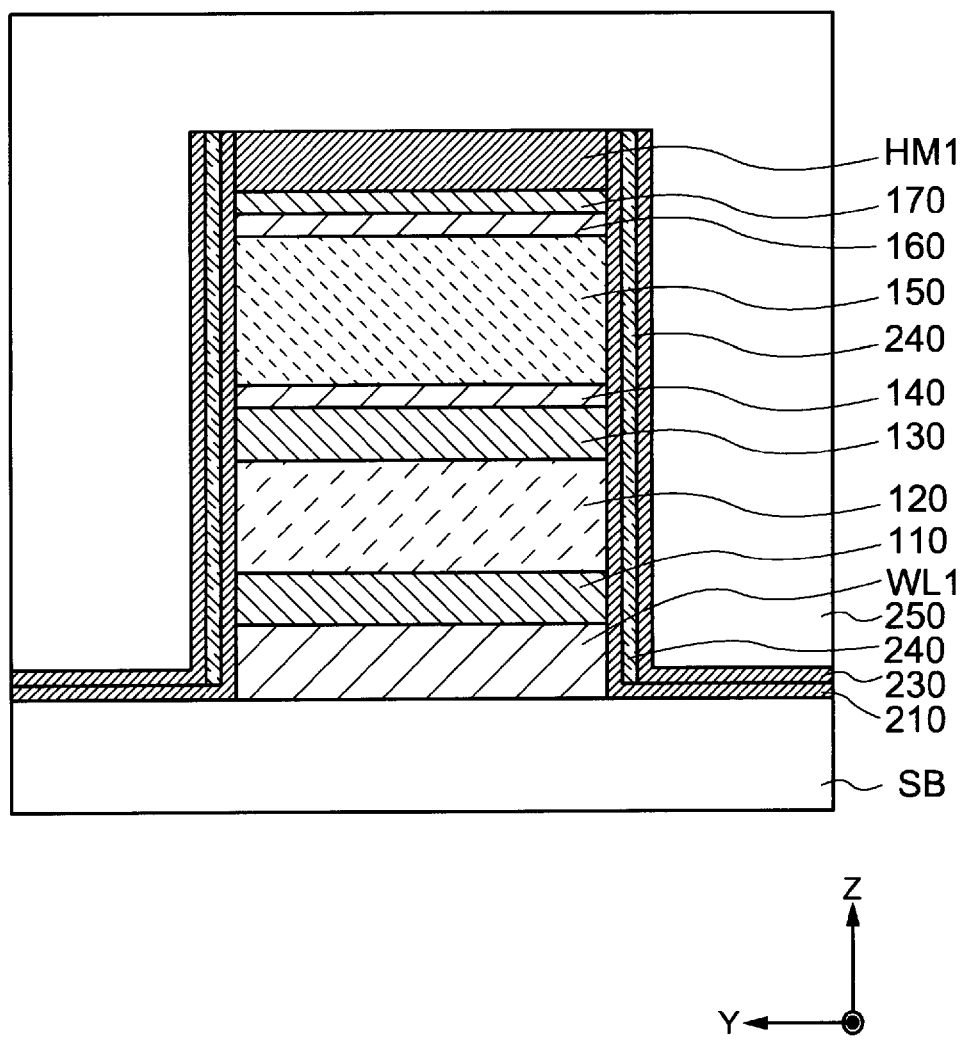
FIG. 9 is a cross-sectional view showing the method for manufacturing the memory cell of the semiconductor storage device.

FIG. 9 is a cross-sectional view of the YZ plane showing a step of further forming the third insulator 250 in the method for manufacturing a semiconductor storage device according to the present embodiment. As shown in FIG. 9, the third insulator 250 is further formed on the stacked structure.

FIG. 10 is a cross-sectional view of the YZ plane showing a step of removing the third insulator 250 and the hard mask HM1 on the stacked structure in the method for manufacturing a semiconductor storage device according to the present embodiment. As shown in FIG. 10, the third insulator 250 and the hard mask HM1 are removed by chemical mechanical polishing (CMP) or the like so that the upper electrode layer 170 on the stacked structure is exposed. As a result, the upper surfaces of the third insulating layer 210, the second sacrifice layer 240, and the fourth insulating layer 230 that surround the side surface of the stacked structure are exposed.

FIG. 11 is a cross-sectional view of the YZ plane showing a step of removing the second sacrifice layer 240 in the method for manufacturing a semiconductor storage device according to the present embodiment. As shown in FIG. 11, the second sacrifice layer 240 is removed by wet etching. When the third insulating layer 210 and the fourth insulating layer 230 are silicon nitride (SiN) films and the second sacrifice layer 240 is an amorphous silicon film, it is desirable that etching removal of the second sacrifice layer 240 is performed by, for example, using wet etching with trimethyl-2 hydroxyethyl ammonium hydroxide (TMY). When the third insulating layer 210 and the fourth insulating layer 230 are silicon oxide (SiO) films and the second sacrifice layer 240 is a silicon nitride (SiN) film, it is desirable to use wet etching with phosphoric acid. By selectively removing the second sacrifice layer 240 as such, it is possible to form the fourth insulator 220 by the air layer surrounded by the third insulating layer 210 and the fourth insulating layer 230.

Figure 12:
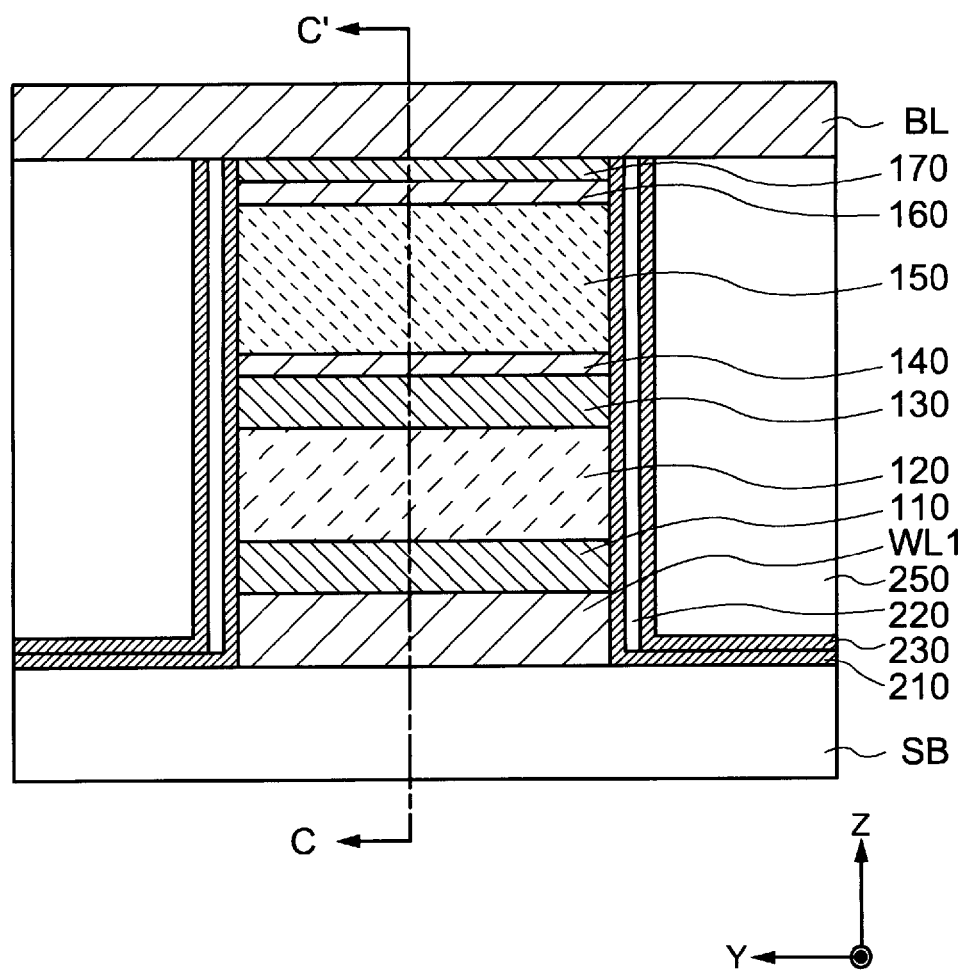
FIG. 12 is a cross-sectional view showing the method for manufacturing the memory cell of the semiconductor storage device.

FIG. 12 is a cross-sectional view of the YZ plane showing a step of forming the bit line BL in the method for manufacturing a semiconductor storage device according to the present embodiment. As shown in FIG. 12, the bit line BL is formed on the stacked structure in which the upper electrode layer 170 is exposed. FIG. 13 shows a cross-sectional view in the XZ plane along the C-C' line shown in FIG. 12.

Figure 14:
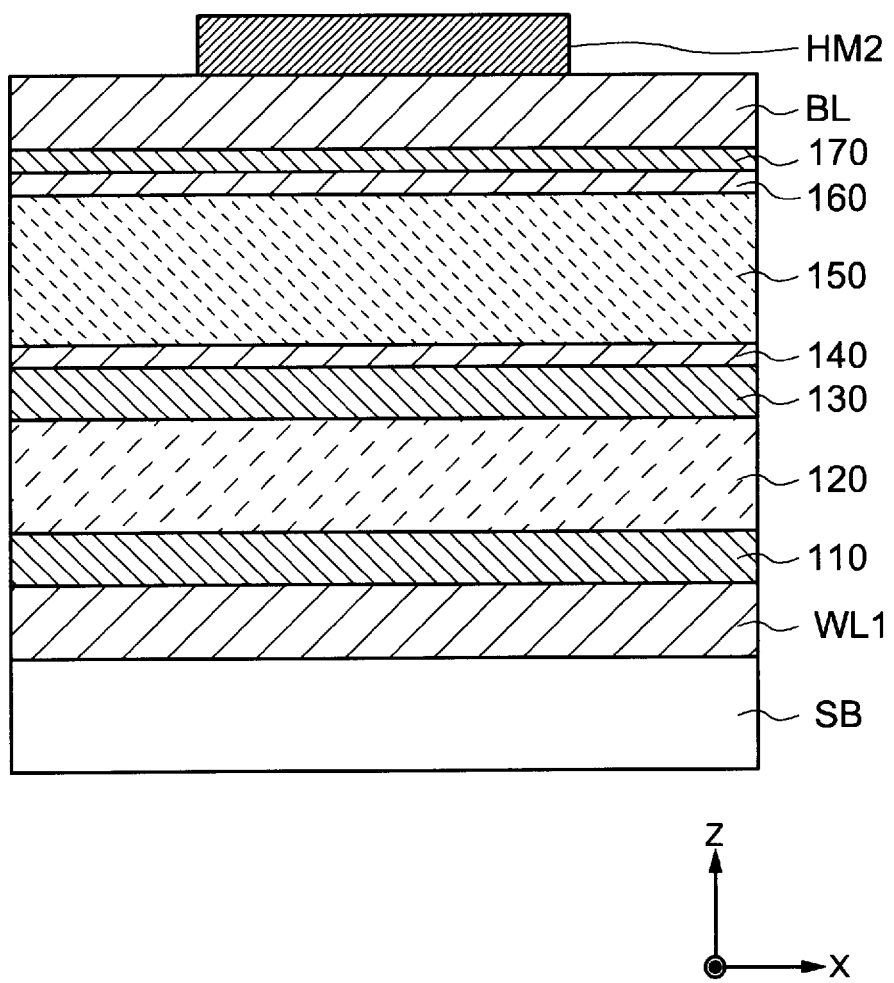
FIG. 14 is a cross-sectional view showing the method for manufacturing the memory cell of the semiconductor storage device.

FIG. 14 is a cross-sectional view of the XZ plane showing a step of forming a hard mask HM2 in the method for manufacturing a semiconductor storage device according to the present embodiment. As shown in FIG. 14, the hard mask HM2 is formed on the bit line BL by lithography.

Figure 15:
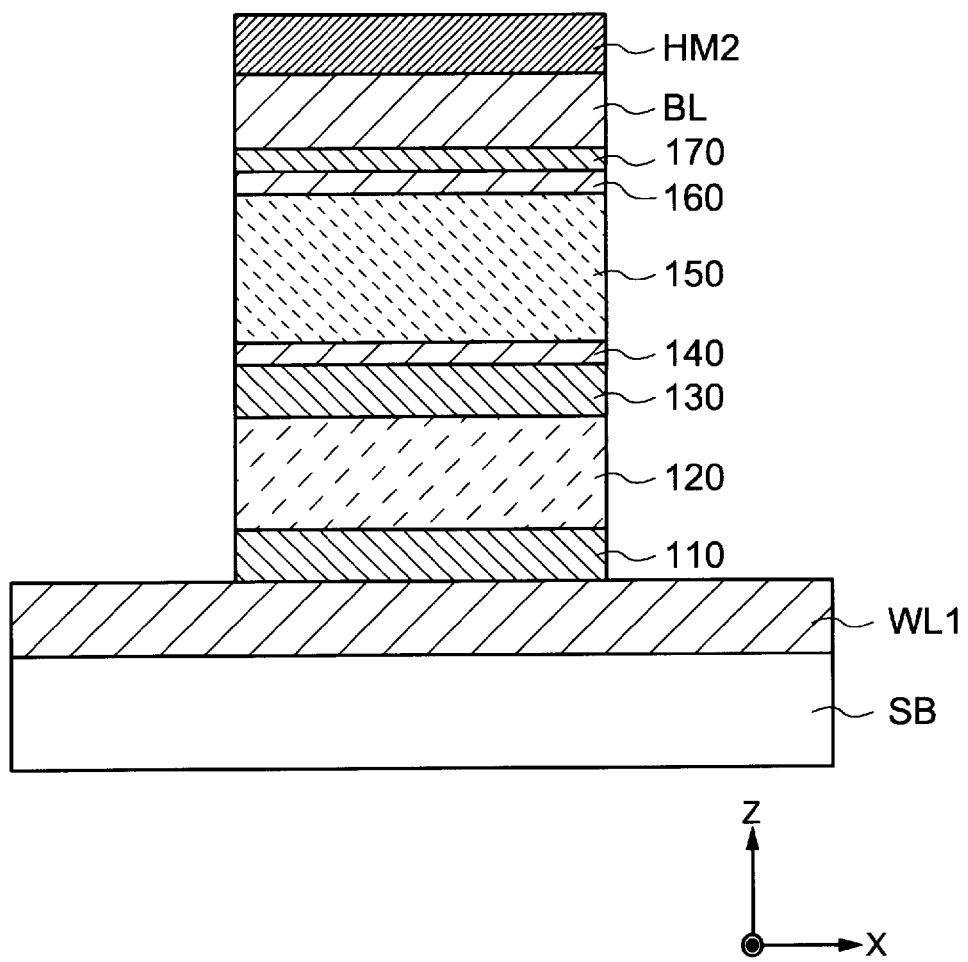
FIG. 15 is a cross-sectional view showing the method for manufacturing the memory cell of the semiconductor storage device.

FIG. 15 is a cross-sectional view of the XZ plane showing a step of dividing (2nd cut) the stacked structure in the method for manufacturing a semiconductor storage device according to the present embodiment. As shown in FIG. 15, for example, a part of the stacked structure is removed from the bit line BL to the lower electrode layer 110 in the Z direction by anisotropic etching such as reactive ion etching (RIE). The stacked structure is divided in the X direction by selectively etching with the line-shaped hard mask HM2 extending in the Y direction. In the region where the stacked structure is removed, a part of the word line WL1 is exposed.

Figure 16:
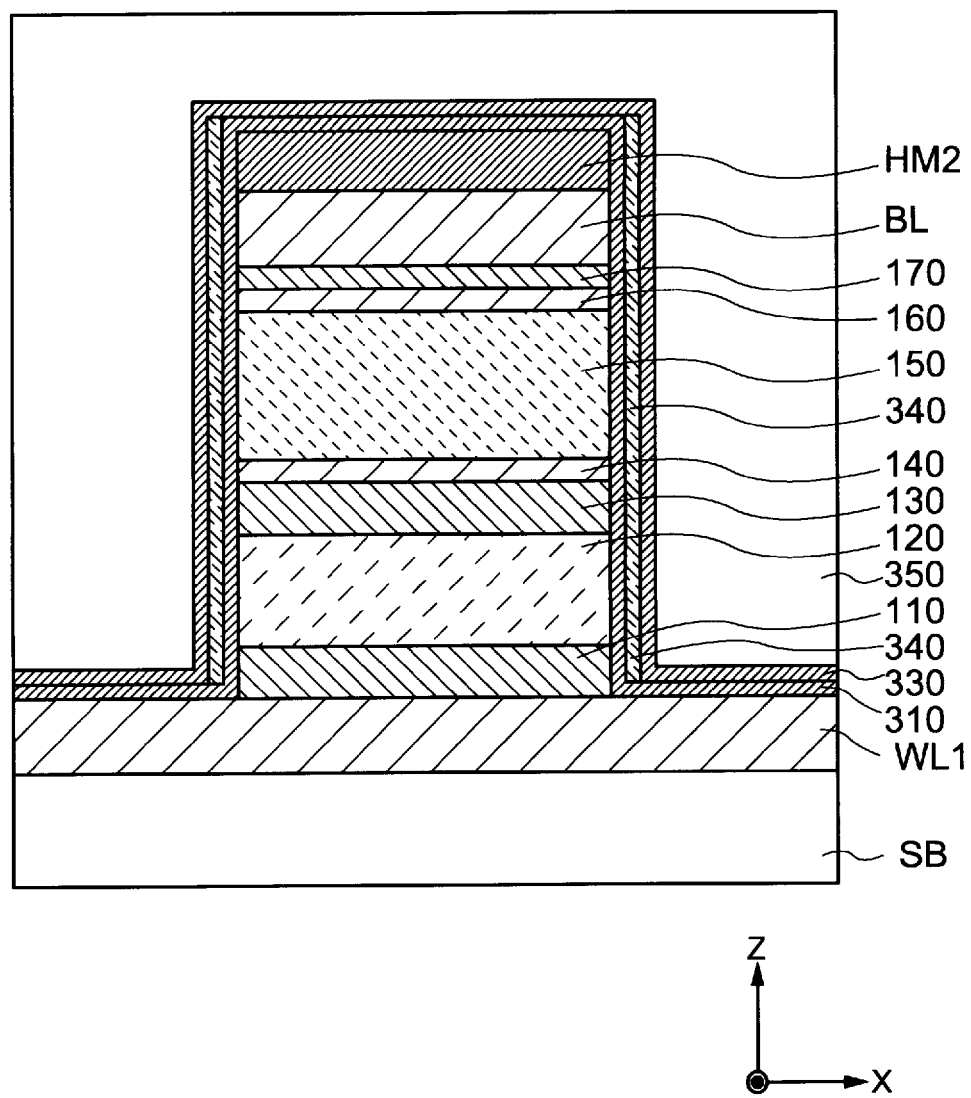
FIG. 16 is a cross-sectional view showing the method for manufacturing the memory cell of the semiconductor storage device.

FIG. 16 is a cross-sectional view of the XZ plane showing a step of forming the insulating layer and the heat-insulating layer in the method for manufacturing a semiconductor storage device according to the present embodiment. As shown in FIG. 16, first, the first insulating layer 310 is formed to cover the stacked structure and the word line WL.

Next, a first sacrifice layer 340 is formed to be in contact with the first insulating layer 310. Subsequently, the first sacrifice layer 340 on the stacked structure and on the word line WL is removed by anisotropic etching such as RIE to expose the upper surface of the first insulating layer 310. Next, the second insulating layer 330 is formed to be in contact with the first sacrifice layer 340 and the first insulating layer 310. By such forming method, the first sacrifice layer 340 is enclosed by the first insulating layer 310 and the second insulating layer 330 and is disposed on the side surface of the stacked structure. Here, the first sacrifice layer 340, the first insulating layer 310, and the second insulating layer 330 may be formed by, for example, CVD or the like. The first insulating layer 310 and the second insulating layer 330 may be silicon nitride (SiN) films and the first sacrifice layer 340 may be an amorphous silicon film. The first insulating layer 310 and the second insulating layer 330 may be silicon oxide (SiO) films and the first sacrifice layer 340 may be a silicon nitride (SiN) film. The first insulating layer 310 and the second insulating layer 330 are preferably made of the same material as the third insulating layer 210 and the fourth insulating layer 230. The first sacrifice layer 340 is preferably made of the same material as the second sacrifice layer 240. The first insulator 350 is formed to embed each of the stacked structures divided by etching.

Figure 17:
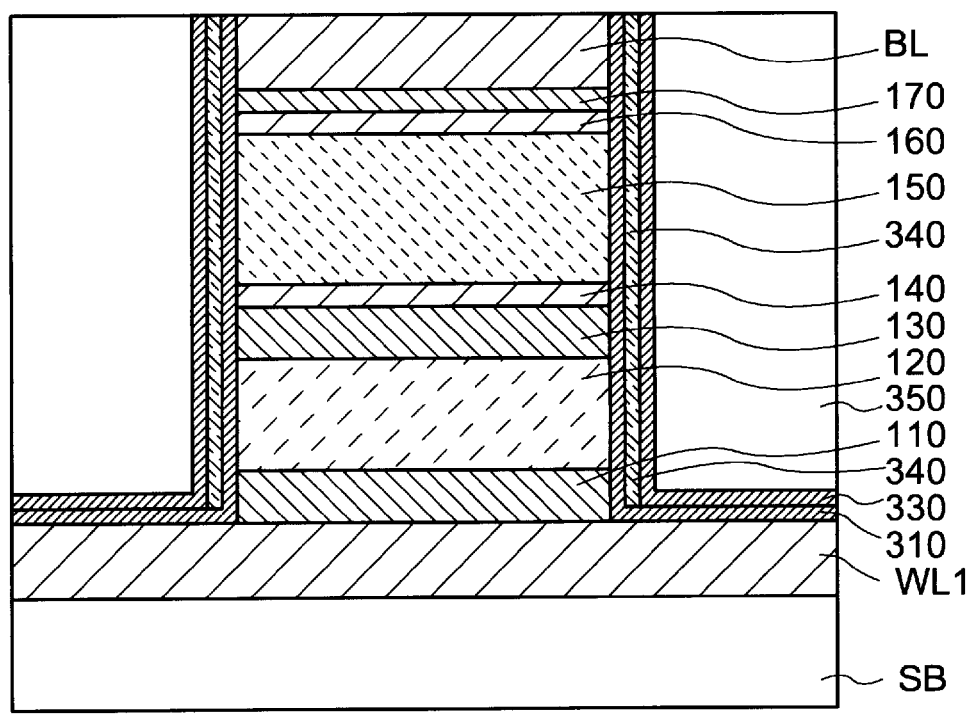
FIG. 17 is a cross-sectional view showing the method for manufacturing the memory cell of the semiconductor storage device.

FIG. 17 is a cross-sectional view of the XZ plane showing a step of removing the first insulator 350, the first insulation layer 310, the second insulation layer 330, and the hard mask HM2 on the stacked structure in the method for manufacturing a semiconductor storage device according to the present embodiment. As shown in FIG. 17, the first insulator 350, the first insulating layer 310, the second insulating layer 330, and the hard mask HM2 are removed by chemical mechanical polishing (CMP) or the like so that the bit line BL on the stacked structure is exposed. As a result, the upper surfaces of the first insulating layer 310, the first sacrifice layer 340, and the second insulating layer 330 that surround the side surface of the stacked structure are exposed.

Figure 18:
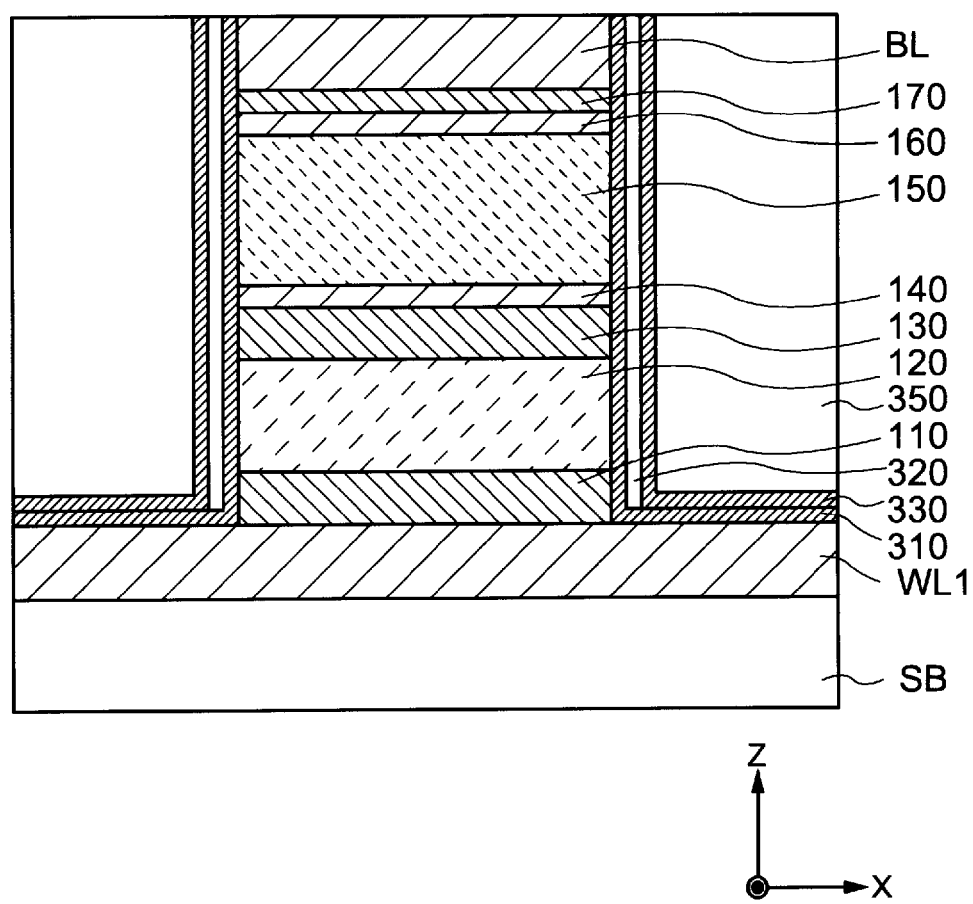
FIG. 18 is a cross-sectional view showing the method for manufacturing the memory cell of the semiconductor storage device.

FIG. 18 is a cross-sectional view of the XZ plane showing a step of removing the first sacrifice layer 340 in the method for manufacturing a semiconductor storage device according to the present embodiment. As shown in FIG. 18, when the first insulating layer 310 and the second insulating layer 330 are silicon nitride (SiN) films and the first sacrifice layer 340 is an amorphous silicon film, it is desirable that the etching removal of the first sacrifice layer 340 is performed by, for example, using wet etching with trimethyl-2 hydroxyethyl ammonium hydroxide (TMY). When the first insulating layer 310 and the second insulating layer 330 are silicon oxide (SiO) films and the first sacrifice layer 340 is a silicon nitride (SiN) film, it is desirable to use wet etching with phosphoric acid. By selectively removing the first sacrifice layer 340 in this way, it is possible to form the second insulator 320 by the air layer surrounded by the first insulating layer 310 and the second insulating layer 330. By the above method, the semiconductor storage device 1 having the configurations shown in FIGS. 4A to 4C can be manufactured.

Although not shown in the drawings, further, by forming a stacked structure including the lower electrode layer 110, the selector layer 120, the intermediate electrode layer 130, the barrier metal layer 140, the variable resistance layer 150, the barrier metal layer 160, the upper electrode layer 170, and the word line WL2, the memory cell MC2 connected in the Z direction can be formed in the same manner as in FIGS. 5 to 18.

The method for manufacturing the semiconductor storage device 1 according to the present embodiment can easily form a heat-insulating layer close to the side surface of the memory cell MC1 by forming the heat-insulating layer surrounded by the insulating layer so as to be in contact with the side surface of the memory cell MC1.

Second Embodiment

The configuration of a semiconductor storage device according to a second embodiment of the present disclosure will be described with reference to FIGS. 19A and 19B. FIGS. 19A and 19B are diagrams showing a configuration of the memory cell (semiconductor element) MC1 of the semiconductor storage device 1 according to the present embodiment. FIG. 19A shows an example of a cross-sectional view of the memory cell MC1 in the YZ plane. FIG. 19B shows an example of a cross-sectional view of the memory cell MC1 in the XZ plane. Since the top view of the memory cell MC1 on the XY plane is the same as that in FIG. 4A, the top view is omitted here. In FIGS. 19A and 19B, one memory cell MC1 is shown but the memory cell MC1 is connected to the memory cells MC1 having the same configurations in the XY plane to form the memory mat MM0. Similarly, in the Z direction, the memory cell MC1 is connected to the memory cells MC2 having the same configurations by sharing the bit line BL to form the memory mat MM1.

The semiconductor storage device 1 according to the present embodiment is the same as the semiconductor storage device 1 according to the first embodiment except that the heat-insulating layer is composed of an air layer and a sacrifice layer, and thus, the description of the common parts will be omitted.

As shown in FIGS. 19A and 19B, the memory cell MC1 includes the word line (first wiring) WL1 extending in the X direction (first direction) disposed on the semiconductor substrate SB side, the bit line (second wiring) BL extending in the Y direction (second direction) arranged opposite to the semiconductor substrate SB with respect to the word line WL1, the memory cell (semiconductor element) MC1 disposed between the word line WL1 and the bit line BL, the insulator disposed between the side surfaces of a plurality of memory cells MC1, the heat-insulating layer disposed between the insulator and the memory cell MC1, and the insulating layer surrounding the heat-insulating layer.

The heat-insulating layer is disposed between the memory cell MC1 and the insulator. The heat-insulating layer includes the first sacrifice layer 340 and the second insulator 320, which are disposed between the memory cell MC1 and the first insulator 350, and the second sacrifice layer 240 and the fourth insulator 220, which are disposed between the memory cell MC1 and the third insulator 250.

The first sacrifice layer 340 extends in the Y direction and is adjacent, in the X direction, to a plurality of memory cells MC1 arranged in the Y direction. The first sacrifice layer 340 extends in the Z direction from the same position as the lower electrode layer 110 to the same position as the selector layer 120. The second insulator 320 is disposed on the first sacrifice layer 340 to be in contact with and overlap the first sacrifice layer 340. The second insulator 320 also extends in the Y direction and is adjacent, in the X direction, to the plurality of memory cells MC1 arranged in the Y direction. The second insulator 320 extends in the Z direction from the same position as the intermediate electrode layer 130 to the same position as the bit line BL.

The second sacrifice layer 240 has a width substantially the same as that of the memory cell MC1 in the X direction and is adjacent to each memory cell MC1 in the Y direction. The second sacrifice layer 240 extends in the Z direction from the same position as the word line WL to the same position as the selector layer 120. The fourth insulator 220 is disposed on the second sacrifice layer 240 to be in contact with and overlap the second sacrifice layer 240. The fourth insulator 220 also has a width substantially the same as that of the memory cell MC1 in the X direction and is adjacent to each memory cell MC1 in the Y direction. The fourth insulator 220 extends in the Z direction from the same position as the intermediate electrode layer 130 to the same position as the upper electrode layer 170.

That is, the first sacrifice layer 340 and the second sacrifice layer 240 surround the side surface of the memory cell MC1 from the lower electrode layer 110 to the selector layer 120. The second insulator 320 and the fourth insulator 220 surround the side surface of the memory cell MC1 from the intermediate electrode layer 130 to the upper electrode layer 170. Here, when the first sacrifice layer 340, the second sacrifice layer 240, the second insulator 320, and the fourth insulator 220 are not distinguished, the layers and insulators are collectively referred to as the heat-insulating layer. In the present embodiment, the first sacrifice layer 340 and the second sacrifice layer 240 are amorphous silicon layers or silicon nitride layers and the second insulator 320 and the fourth insulator 220 are air layers. The thickness of the first sacrifice layer 340 and the second insulator 320 in the X direction and the thickness of the second sacrifice layer 240 and the fourth insulator 220 in the Y direction may be, for example, about 2 nm.

In the semiconductor storage device 1 according to the present embodiment, the thermal resistance of the memory cell MC1 can be improved and the heat retention can be improved by arranging the heat-insulating layer to surround the side surface of the memory cell MC1. By arranging the heat-insulating layer to surround the side surface of the memory cell MC1, the withstand voltage of the memory cell MC1 can be improved. In particular, by arranging the heat-insulating layer which is an air layer to surround the side surface of the memory cell MC1 from the intermediate electrode layer 130 to the upper electrode layer 170, the heat retention can be efficiently improved.

The insulating layer surrounds the heat-insulating layer. The insulating layer includes the first insulating layer 310, the second insulating layer 330, the third insulating layer 210, and the fourth insulating layer 230. The first insulating layer 310 is disposed between the memory cell MC1, and the first sacrifice layer 340 and the second insulator 320. The second insulating layer 330 is disposed between the first insulating layer 350, and the first sacrifice layer 340 and the second insulator 320. The first insulating layer 310 extends in the Y direction and is in contact with the first sacrifice layer 340 and the second insulator 320. The first insulating layer 310 is in contact with a plurality of memory cells MC1, second sacrifice layers 240, fourth insulators 220, and third insulating layers 250, which are arranged in the Y direction, on the side opposite to the first sacrifice layer 340 and the second insulator 320. The first insulating layer 310 is disposed on the side opposite to the first sacrifice layer 340 and the second insulator 320 and in contact with the third insulating layer 210 and the fourth insulating layer 230, which will be further described later. The second insulating layer 330 extends in the Y direction and is in contact with the first sacrifice layer 340 and the second insulator 320. The second insulating layer 330 is in contact with the first insulator 350 on the side opposite to the first sacrifice layer 340 and the second insulator 320. The first insulating layer 310 and the second insulating layer 330 extend in the Z direction from the same position as the lower electrode layer 110 to the same position as the bit line BL. The first insulating layer 310 is in contact with the upper surface of the word line WL1 in a region where the memory cell MC1 is not provided. The second insulating layer 330 is in contact with the first insulating layer 310 in a region on the word line WL1 where the memory cell MC1 is not provided. That is, the bottom surface of the first sacrifice layer 340 and the side surfaces of the first sacrifice layer 340 and the second insulator 320 are surrounded by the first insulating layer 310 and the second insulating layer 330. The bottom surface and the side surface of the first insulator 350 are surrounded by the second insulation layer 330.

The third insulating layer 210 is disposed between the memory cell MC1, and the second sacrifice layer 240 and the fourth insulator 220. The fourth insulating layer 230 is disposed between the third insulating layer 250, and the second sacrifice layer 240 and the fourth insulator 220. The third insulating layer 210 has a width substantially the same as that of the memory cell MC1 in the X direction and is in contact with the memory cell MC1, the second sacrifice layer 240, and the fourth insulator 220. The fourth insulating layer 230 has a width substantially the same as that of the memory cell MC1 in the X direction and is in contact with the third insulator 250, the second sacrifice layer 240, and the fourth insulator 220. The third insulating layer 210 and the fourth insulating layer 230 are connected to the first insulating layer 310. The third insulating layer 210 and the fourth insulating layer 230 extend in the Z direction from the same position as the word line WL to the same position as the upper electrode layer 170. The third insulating layer 210 is in contact with the upper surface of the semiconductor substrate SB in a region where the memory cell MC1 is not provided. The fourth insulating layer 230 is in contact with the third insulating layer 210 in a region on the semiconductor substrate SB where the memory cell MC1 is not provided. That is, the side surface of the memory cell MC1 is surrounded by the first insulating layer 310 and the third insulating layer 210. The bottom surface and the side surface of the third insulator 250 are surrounded by the first insulating layer 310 and the fourth insulating layer 230. The bottom surface of the second sacrifice layer 240 and the side surfaces of the second sacrifice layer 240 and the fourth insulator 220 are surrounded by the first insulating layer 310, the third insulating layer 210, and the fourth insulating layer 230.

In the semiconductor storage device 1 according to the present embodiment, the heat retention of the memory cell MC1 can be improved by arranging the heat-insulating layer sandwiched between the insulating layers in contact with the side surface of the memory cell MC1. In particular, by arranging a heat-insulating layer which is an air layer to surround the side surface of the memory cell MC1 from the intermediate electrode layer 130 to the upper electrode layer 170, the heat retention can be efficiently improved. By improving the heat retention of the memory cell MC1, the reset current can be reduced and the power consumption can be reduced. Further, by improving the heat retention of the memory cell MC1, heat conduction to the adjacent memory cell MC1 can be reduced and malfunction can be reduced. On the other hand, by arranging a heat-insulating layer which is an amorphous silicon layer or a silicon nitride layer to surround the side surface of the memory cell MC1 from the lower electrode layer 110 to the selector layer 120, it is possible to prevent the first insulating layer 310 and the second insulating layer 330, the third insulating layer 210, and the fourth insulating layer 230 from being twisted (bent), and the second insulator 320 and the fourth insulator 220 can be held.

The method for manufacturing the semiconductor storage device according to the present embodiment is omitted here because the semiconductor storage device 1 having the configurations shown in FIGS. 19A and 19B can be manufactured by appropriately adjusting the etching conditions in the step of removing the second sacrifice layer 240 (FIG. 11) and the step of removing the first sacrifice layer 340 (FIG. 18) in the first embodiment.

In the method for manufacturing the semiconductor storage device 1 according to the present embodiment, by leaving a part of the second sacrifice layer 240 between the third insulating layer 210 and the fourth insulating layer 230 in the step of removing the second sacrifice layer 240 (FIG. 11) in the first embodiment, it is possible to prevent the third insulating layer 210 and the fourth insulating layer 230 from being twisted (bent) in the step of dividing (2nd cut) the stacked structure (FIG. 15) and the fourth insulator 220 can be held. By leaving a part of the first sacrifice layer 340 between the first insulating layer 310 and the second insulating layer 330 in the step of removing the first sacrifice layer 340 (FIG. 18), it is possible to prevent the first insulating layer 310 and the second insulating layer 330 from being twisted (bent) in the later steps and the second insulating layer 320 can be held.

Third Embodiment

Figure 20A:
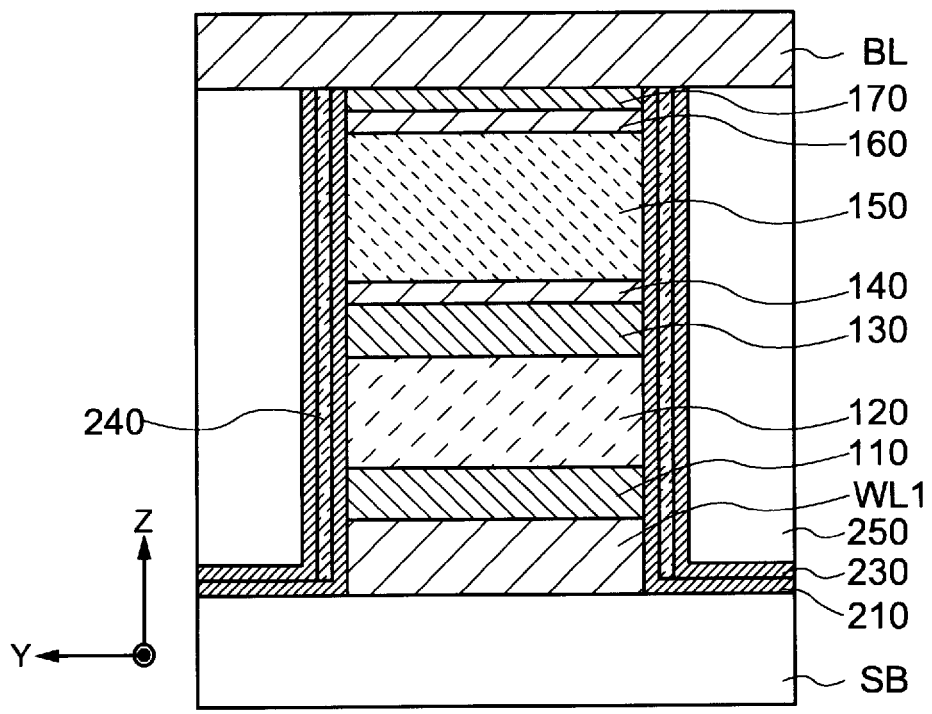
FIG. 20A is a cross-sectional view showing the configuration of the memory cell of the semiconductor storage device.
Figure 20B:
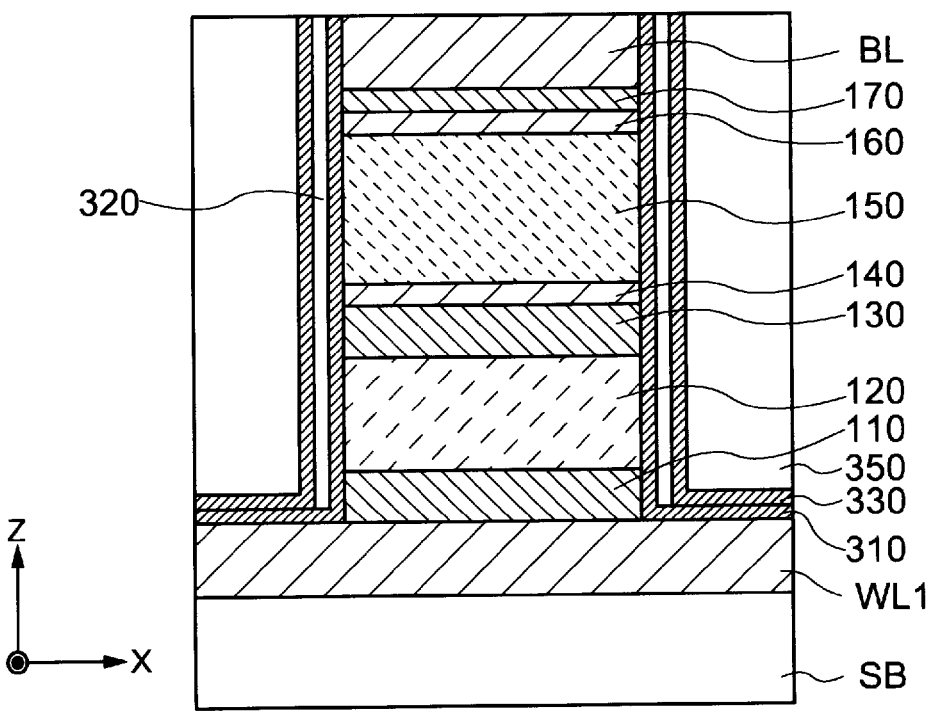
FIG. 20B is a cross-sectional view showing the configuration of the memory cell of the semiconductor storage device.

The configuration of a semiconductor storage device according to a third embodiment of the present disclosure will be described with reference to FIGS. 20A and 20B. FIGS. 20A and 20B are diagrams showing the configuration of the memory cell (semiconductor element) MC1 of the semiconductor storage device 1 according to the present embodiment. FIG. 20A shows an example of a cross-sectional view of the memory cell MC1 in the YZ plane. FIG. 20B shows an example of a cross-sectional view of the memory cell MC1 in the XZ plane. In FIGS. 20A and 20B, one memory cell MC1 is shown but the memory cell MC1 is connected to the memory cells MC1 having the same configurations in the XY plane to form the memory mat MM0. Similarly, in the Z direction, the memory cell MC1 is connected to the memory cells MC2 having the same configurations by sharing the bit line BL to form the memory mat MM1.

Since the semiconductor storage device 1 according to the present embodiment is the same as the semiconductor storage device 1 according to the first embodiment except that the second sacrifice layer 240 is arranged instead of the fourth insulator 220, and thus, the description of the common parts will be omitted.

As shown in FIGS. 20A and 20B, the memory cell MC1 includes the word line (first wiring) WL1 extending in the X direction (first direction) disposed on the semiconductor substrate SB side, the bit line (second wiring) BL extending in the Y direction (second direction) arranged opposite to the semiconductor substrate SB with respect to the word line WL1, the memory cell (semiconductor element) MC1 disposed between the word line WL1 and the bit line BL, the insulator disposed between the side surfaces of a plurality of memory cells MC1, the heat-insulating layer disposed between the insulator and the memory cell MC1, and the insulating layer surrounding the heat-insulating layer.

The heat-insulating layer is disposed between the memory cell MC1 and the insulator. The heat-insulating layer includes the second insulator 320 disposed between the memory cell MC1 and the first insulator 350, and the second sacrifice layer 240 disposed between the memory cell MC1 and the third insulator 250.

The second insulator 320 extends in the Y direction and is adjacent, in the X direction, to a plurality of memory cells MC1 arranged in the Y direction. The second insulator 320 extends in the Z direction from the same position as the lower electrode layer 110 to the same position as the bit line BL. The second sacrifice layer 240 has a width substantially the same as that of the memory cell MC1 in the X direction and is adjacent to each memory cell MC1 in the Y direction. The second sacrifice layer 240 extends in the Z direction from the same position as the word line WL to the same position as the upper electrode layer 170.

That is, the second insulator 320 and the second sacrifice layer 240 surround the side surface of the memory cell MC1. Here, when the second insulator 320 and the second sacrifice layer 240 are not distinguished, the second insulator 320 and the second sacrifice layer 240 are collectively referred to as the heat-insulating layer. In the present embodiment, the second insulator 320 is an air layer and the second sacrifice layer 240 is an amorphous silicon layer or a silicon nitride layer. The thickness of the second insulator 320 in the X direction and the thickness of the second sacrifice layer 240 in the Y direction may be, for example, about 2 nm.

In the semiconductor storage device 1 according to the present embodiment, the thermal resistance of the memory cell MC1 can be improved and the heat retention can be improved by arranging the heat-insulating layer to surround the side surface of the memory cell MC1. By arranging the heat-insulating layer to surround the side surface of the memory cell MC1, the withstand voltage of the memory cell MC1 can be improved. In particular, by arranging the heat-insulating layer, which is an air layer, to sandwich the side surface of the memory cell MC1, the heat retention can be efficiently improved.

The insulating layer surrounds the heat-insulating layer. The insulating layer includes the first insulating layer 310, the second insulating layer 330, the third insulating layer 210, and the fourth insulating layer 230. The first insulating layer 310 is disposed between the memory cell MC1 and the second insulator 320. The second insulating layer 330 is disposed between the first insulator 350 and the second insulator 320. The first insulating layer 310 extends in the Y direction and is in contact with the second insulator 320. The first insulating layer 310 is in contact with a plurality of memory cells MC1, second sacrifice layers 240, and third insulators 250, which are arranged in the Y direction, on the side opposite to the second insulator 320. The first insulating layer 310 is disposed on the side opposite to the second insulator 320 and in contact with the third insulating layer 210 and the fourth insulating layer 230, which will be further described later. The second insulating layer 330 extends in the Y direction and is in contact with the second insulator 320. The second insulating layer 330 is in contact with the first insulator 350 on the side opposite to the second insulator 320. The first insulating layer 310 and the second insulating layer 330 extend in the Z direction from the same position as the lower electrode layer 110 to the same position as the bit line BL. The first insulating layer 310 is in contact with the upper surface of the word line WL1 in a region where the memory cell MC1 is not provided. The second insulating layer 330 is in contact with the first insulating layer 310 in a region on the word line WL1 where the memory cell MC1 is not provided. That is, the bottom surface and the side surface of the second insulator 320 are surrounded by the first insulating layer 310 and the second insulating layer 330. The bottom surface and the side surface of the first insulator 350 are surrounded by the second insulation layer 330.

The third insulating layer 210 is disposed between the memory cell MC1 and the second sacrifice layer 240. The fourth insulating layer 230 is disposed between the third insulating layer 250 and the second sacrifice layer 240. The third insulating layer 210 has a width substantially the same as that of the memory cell MC1 in the X direction and is in contact with the memory cell MC1 and the second sacrifice layer 240. The fourth insulating layer 230 has a width substantially the same as that of the memory cell MC1 in the X direction and is in contact with the third insulator 250 and the second sacrifice layer 240. The third insulating layer 210 and the fourth insulating layer 230 are connected to the first insulating layer 310. The third insulating layer 210 and the fourth insulating layer 230 extend in the Z direction from the same position as the word line WL to the same position as the upper electrode layer 170. The third insulating layer 210 is in contact with the upper surface of the semiconductor substrate SB in a region where the memory cell MC1 is not provided. The fourth insulating layer 230 is in contact with the third insulating layer 210 in a region on the semiconductor substrate SB where the memory cell MC1 is not provided. That is, the side surface of the memory cell MC1 is surrounded by the first insulating layer 310 and the third insulating layer 210. The bottom surface and the side surface of the third insulator 250 are surrounded by the first insulating layer 310 and the fourth insulating layer 230. The bottom surface and the side surface of the second sacrifice layer 240 are surrounded by the first insulating layer 310, the third insulating layer 210, and the fourth insulating layer 230.

In the semiconductor storage device 1 according to the present embodiment, the heat retention of the memory cell MC1 can be improved by arranging the heat-insulating layer sandwiched between the insulating layers in contact with the side surface of the memory cell MC1. In particular, by arranging the heat-insulating layer, which is an air layer, to sandwich the side surface of the memory cell MC1, the heat retention can be efficiently improved. By improving the heat retention of the memory cell MC1, the reset current can be reduced and the power consumption can be reduced. By improving the heat retention of the memory cell MC1, heat conduction to the adjacent memory cell MC1 can be reduced and malfunction can be reduced.

The method for manufacturing a semiconductor storage device according to the present embodiment is omitted here because the semiconductor storage device 1 having the configurations shown in FIGS. 20A and 20B can be manufactured by omitting the step of removing the second sacrifice layer 240 (FIG. 11) in the first embodiment.

In the method for manufacturing the semiconductor storage device 1 according to the present embodiment, by leaving the second sacrifice layer 240 between the third insulating layer 210 and the fourth insulating layer 230 in the step of removing the second sacrifice layer 240 (FIG. 11) in the first embodiment, it is possible to prevent the third insulating layer 210 and the fourth insulating layer 230 from being twisted (bent) in the step of dividing (2nd cut) the stacked structure (FIG. 15).

Fourth Embodiment

Figure 21A:
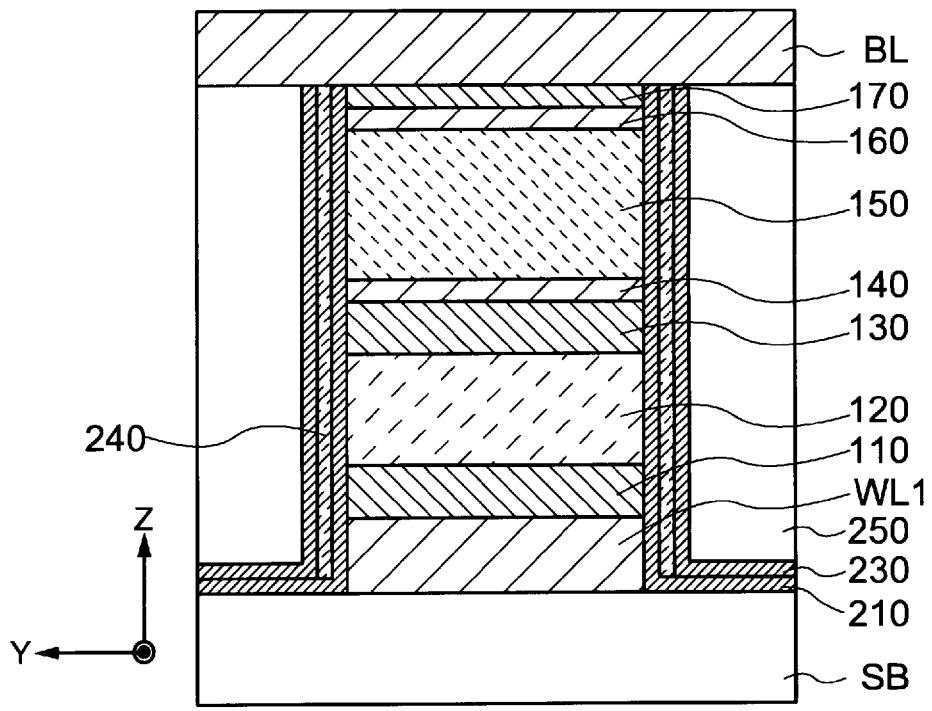
FIG. 21A is a cross-sectional view showing the configuration of the memory cell of the semiconductor storage device.
Figure 21B:
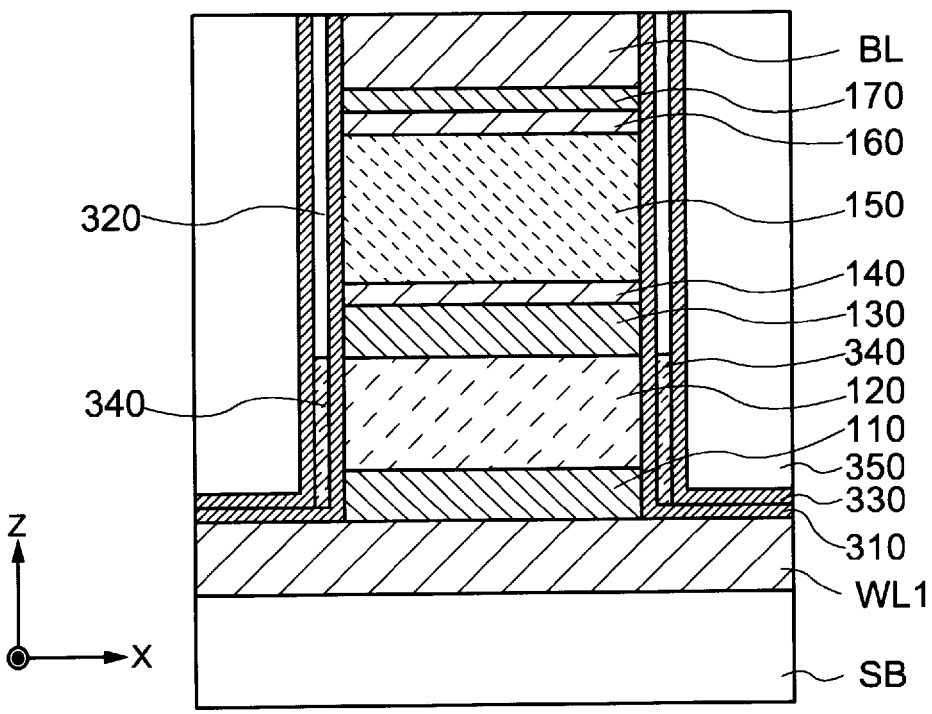
FIG. 21B is a cross-sectional view showing the configuration of the memory cell of the semiconductor storage device.

The configuration of a semiconductor storage device according to a fourth embodiment of the present disclosure will be described with reference to FIGS. 21A and 21B. FIGS. 21A and 21B are diagrams showing the configuration of the memory cell (semiconductor element) MC1 of the semiconductor storage device 1 according to the present embodiment. FIG. 21A shows an example of a cross-sectional view of the memory cell MC1 in the YZ plane. FIG. 21B shows an example of a cross-sectional view of the memory cell MC1 in the XZ plane. In FIGS. 21A and 21B, one memory cell MC1 is shown but the memory cell MC1 is connected to the memory cells MC1 having the same configurations in the XY plane to form the memory mat MM0. Similarly, in the Z direction, the memory cell MC1 is connected to the memory cells MC2 having the same configurations by sharing the bit line BL to form the memory mat MM1.

The semiconductor storage device 1 according to the present embodiment is the same as the semiconductor storage device 1 according to the first embodiment except that the first sacrifice layer 340 is disposed together with the second insulator 320 and the second sacrifice layer 240 is arranged instead of the fourth insulator 220, and thus, the description of the common parts will be omitted.

As shown in FIGS. 21A and 21B, the memory cell MC1 includes the word line (first wiring) WL1 extending in the X direction (first direction) disposed on the semiconductor substrate SB side, the bit line (second wiring) BL extending in the Y direction (second direction) arranged opposite to the semiconductor substrate SB with respect to the word line WL1, the memory cell (semiconductor element) MC1 disposed between the word line WL1 and the bit line BL, the insulator disposed between the side surfaces of a plurality of memory cells MC1, the heat-insulating layer disposed between the insulator and the memory cell MC1, and the insulating layer surrounding the heat-insulating layer.

The heat-insulating layer is disposed between the memory cell MC1 and the insulator. The heat-insulating layer includes the first sacrifice layer 340 and the second insulator 320, which are disposed between the memory cell MC1 and the first insulator 350, and the second sacrifice layer 240 disposed between the memory cell MC1 and the third insulator 250.

The first sacrifice layer 340 extends in the Y direction and is adjacent, in the X direction, to a plurality of memory cells MC1 arranged in the Y direction. The first sacrifice layer 340 extends in the Z direction from the same position as the lower electrode layer 110 to the same position as the selector layer 120. The second insulator 320 is disposed on the first sacrifice layer 340 to be in contact with and overlap the first sacrifice layer 340. The second insulator 320 also extends in the Y direction and is adjacent, in the X direction, to the plurality of memory cells MC1 arranged in the Y direction. The second insulator 320 extends in the Z direction from the same position as the intermediate electrode layer 130 to the same position as the bit line BL. The second sacrifice layer 240 has a width substantially the same as that of the memory cell MC1 in the X direction and is adjacent to each memory cell MC1 in the Y direction. The second sacrifice layer 240 extends in the Z direction from the same position as the word line WL to the same position as the upper electrode layer 170.

That is, the first sacrifice layer 340, the second insulator 320, and the second sacrifice layer 240 surround the side surface of the memory cell MC1. Here, when the first sacrifice layer 340, the second insulator 320, and the second sacrifice layer 240 are not distinguished, the layers and insulator are collectively referred to as the heat-insulating layer. In the present embodiment, the second insulator 320 is an air layer and the first sacrifice layer 340 and the second sacrifice layer 240 are amorphous silicon layers or silicon nitride layers. The thickness of the first sacrifice layer 340 and the second insulator 320 in the X direction and the thickness of the second sacrifice layer 240 in the Y direction may be, for example, about 2 nm.

In the semiconductor storage device 1 according to the present embodiment, the thermal resistance of the memory cell MC1 can be improved and the heat retention can be improved by arranging the heat-insulating layer to surround the side surface of the memory cell MC1. By arranging the heat-insulating layer to surround the side surface of the memory cell MC1, the withstand voltage of the memory cell MC1 can be improved. In particular, by arranging the heat-insulating layer, which is an air layer, to sandwich the side surface of the memory cell MC1 from the intermediate electrode layer 130 to the bit line BL, the heat retention can be efficiently improved.

The insulating layer surrounds the heat-insulating layer. The insulating layer includes the first insulating layer 310, the second insulating layer 330, the third insulating layer 210, and the fourth insulating layer 230. The first insulating layer 310 is disposed between the memory cell MC1, and the first sacrifice layer 340 and the second insulator 320. The second insulating layer 330 is disposed between the first insulator 350, and the first sacrifice layer 340 and the second insulator 320. The first insulating layer 310 extends in the Y direction and is in contact with the first sacrifice layer 340 and the second insulator 320. The first insulating layer 310 is in contact with a plurality of memory cells MC1, second sacrifice layers 240, and third insulators 250, which are arranged in the Y direction, on the side opposite to the first sacrifice layer 340 and the second insulator 320. The first insulating layer 310 is disposed on the side opposite to the first sacrifice layer 340 and the second insulator 320 and in contact with the third insulating layer 210 and the fourth insulating layer 230, which will be described later. The second insulating layer 330 extends in the Y direction and is in contact with the first sacrifice layer 340 and the second insulator 320. The second insulating layer 330 is in contact with the first insulator 350 on the side opposite to the first sacrifice layer 340 and the second insulator 320. The first insulating layer 310 and the second insulating layer 330 extend in the Z direction from the same position as the lower electrode layer 110 to the same position as the bit line BL. The first insulating layer 310 is in contact with the upper surface of the word line WL1 in a region where the memory cell MC1 is not provided. The second insulating layer 330 is in contact with the first insulating layer 310 in a region on the word line WL1 where the memory cell MC1 is not provided. That is, the bottom surface and the side surfaces of the first sacrifice layer 340 and the second insulator 320 are surrounded by the first insulating layer 310 and the second insulating layer 330. The bottom surface and the side surface of the first insulator 350 are surrounded by the second insulation layer 330.

The third insulating layer 210 is disposed between the memory cell MC1 and the second sacrifice layer 240. The fourth insulating layer 230 is disposed between the third insulating layer 250 and the second sacrifice layer 240. The third insulating layer 210 has a width substantially the same as that of the memory cell MC1 in the X direction and is in contact with the memory cell MC1 and the second sacrifice layer 240. The fourth insulating layer 230 has a width substantially the same as that of the memory cell MC1 in the X direction and is in contact with the third insulator 250 and the second sacrifice layer 240. The third insulating layer 210 and the fourth insulating layer 230 are connected to the first insulating layer 310. The third insulating layer 210 and the fourth insulating layer 230 extend in the Z direction from the same position as the word line WL to the same position as the upper electrode layer 170. The third insulating layer 210 is in contact with the upper surface of the semiconductor substrate SB in a region where the memory cell MC1 is not provided. The fourth insulating layer 230 is in contact with the third insulating layer 210 in a region on the semiconductor substrate SB where the memory cell MC1 is not provided. That is, the side surface of the memory cell MC1 is surrounded by the first insulating layer 310 and the third insulating layer 210. The bottom surface and the side surface of the third insulator 250 are surrounded by the first insulating layer 310 and the fourth insulating layer 230. The bottom surface and the side surface of the second sacrifice layer 240 are surrounded by the first insulating layer 310, the third insulating layer 210, and the fourth insulating layer 230.

In the semiconductor storage device 1 according to the present embodiment, the heat retention of the memory cell MC1 can be improved by arranging the heat-insulating layer sandwiched between the insulating layers in contact with the side surface of the memory cell MC1. In particular, by arranging the heat-insulating layer, which is an air layer, to sandwich the side surface of the memory cell MC1 from the intermediate electrode layer 130 to the bit line BL, the heat retention can be efficiently improved. By improving the heat retention of the memory cell MC1, the reset current can be reduced and the power consumption can be reduced. By improving the heat retention of the memory cell MC1, heat conduction to the adjacent memory cell MC1 can be reduced and malfunction can be reduced.

The method for manufacturing the semiconductor storage device according to the present embodiment is omitted here because the semiconductor storage device 1 having the configurations shown in FIGS. 21A and 21B can be manufactured by omitting the step of removing the second sacrifice layer 240 (FIG. 11) and appropriately adjusting the etching conditions in the step of removing the first sacrifice layer 340 (FIG. 18) in the first embodiment.

In the method for manufacturing the semiconductor storage device 1 according to the present embodiment, by leaving the second sacrifice layer 240 between the third insulating layer 210 and the fourth insulating layer 230 in the step of removing the second sacrifice layer 240 in the first embodiment (FIG. 11), it is possible to prevent the third insulating layer 210 and the fourth insulating layer 230 from being twisted (bent) in the step of dividing (2nd cut) the stacked structure (FIG. 15). By leaving a part of the first sacrifice layer 340 between the first insulating layer 310 and the second insulating layer 330 in the step of removing the first sacrifice layer 340 (FIG. 18), it is possible to prevent the first insulating layer 310 and the second insulating layer 330 from being twisted (bent) in the later steps and the second insulating layer 320 can be held.

Modification 1

Figure 22A:
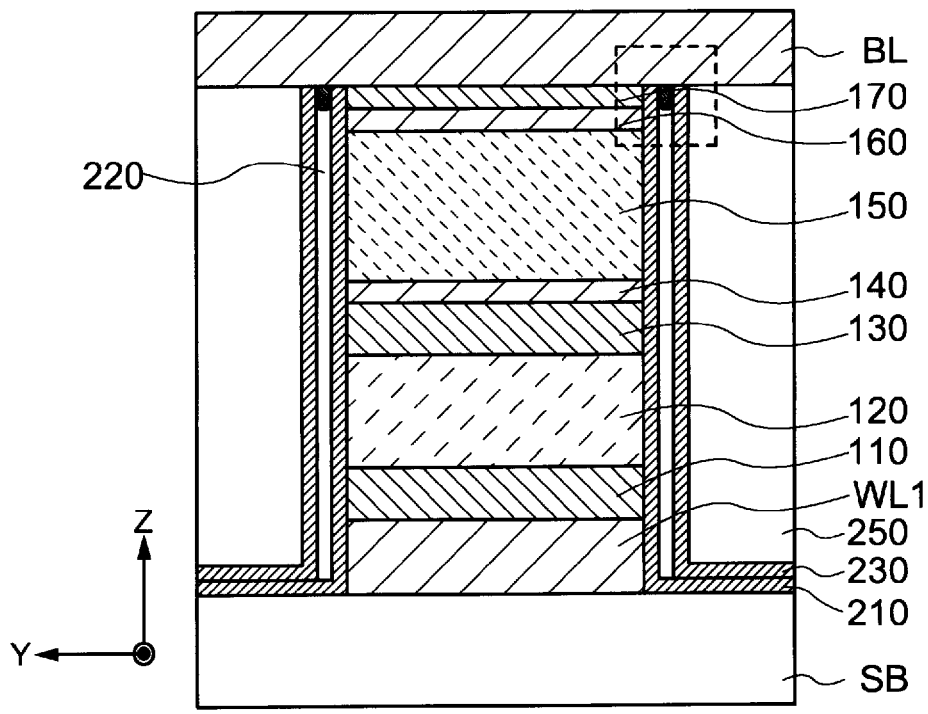
FIG. 22A is a cross-sectional view showing a configuration of a memory cell of a semiconductor storage device according to a modification.
Figure 22B:
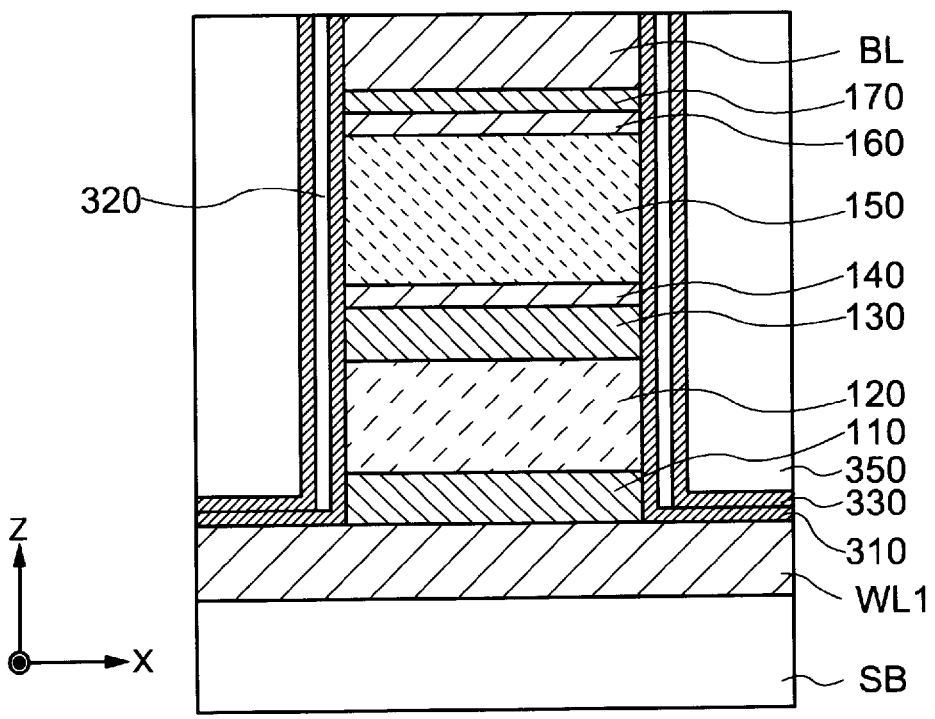
FIG. 22B is a cross-sectional view showing the configuration of the memory cell of the semiconductor storage device.
Figure 22C:
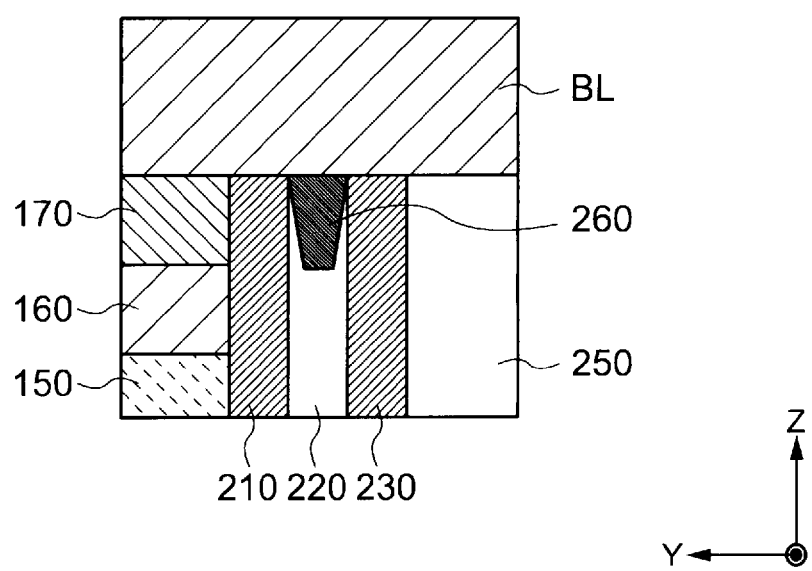
FIG. 22C is an enlarged cross-sectional view showing the configuration of the memory cell of the semiconductor storage device.

The configuration of the semiconductor storage device according to Modification 1 of the present disclosure will be described with reference to FIGS. 22A to 22C. FIGS. 22A to 22C are diagrams showing the configuration of the memory cell (semiconductor element) MC1 of the semiconductor storage device 1 according to the modification. FIG. 22A shows an example of a cross-sectional view of the memory cell MC1 in the YZ plane. FIG. 22B shows an example of a cross-sectional view of the memory cell MC1 in the XZ plane. FIG. 22C shows an example of an enlarged cross-sectional view of the memory cell MC1 in the area shown by the dotted line shown in FIG. 22B. In FIGS. 22A to 22C, one memory cell MC1 is shown but the memory cell MC1 is connected to the memory cells MC1 having the same configurations in the XY plane to form the memory mat MM0. Similarly, in the Z direction, the memory cell MC1 is connected to the memory cells MC2 having the same configurations by sharing the bit line BL to form the memory mat MM1.

The semiconductor storage device 1 according to the present modification is the same as the semiconductor storage device 1 according to the first embodiment except that a spacer 260 is arranged at the upper end of the fourth insulator 220, and thus, the description of the common parts will be omitted.

As shown in FIGS. 22A to 22C, the memory cell MC1 includes the word line (first wiring) WL1 extending in the X direction (first direction) disposed on the semiconductor substrate SB side, the bit line (second wiring) BL extending in the Y direction (second direction) arranged opposite to the semiconductor substrate SB with respect to the word line WL1, the memory cell (semiconductor element) MC1 disposed between the word line WL1 and the bit line BL, the insulator disposed between the side surfaces of a plurality of memory cells MC1, the heat-insulating layer disposed between the insulator and the memory cell MC1, and the insulating layer surrounding the heat-insulating layer.

The heat-insulating layer is disposed between the memory cell MC1 and the insulator. The heat-insulating layer includes the second insulator 320 disposed between the memory cell MC1 and the first insulator 350, and the fourth insulator 220 disposed between the memory cell MC1 and the third insulator 250.

The second insulator 320 extends in the Y direction and is adjacent, in the X direction, to a plurality of memory cells MC1 arranged in the Y direction. The second insulator 320 extends in the Z direction from the same position as the lower electrode layer 110 to the same position as the bit line BL. The fourth insulator 220 has a width substantially the same as that of the memory cell MC1 in the X direction and is adjacent to each memory cell MC1 in the Y direction. The fourth insulator 220 extends in the Z direction from the same position as the word line WL to the same position as the barrier metal layer 160.

The spacer 260 is arranged at the upper end of the fourth insulator 220, which is disposed between the memory cell MC1 and the third insulator 250. The spacer 260 is arranged at the same position as the upper electrode layer 170 in the Z direction. The spacer 260, together with the fourth insulator 220, is surrounded by the first insulating layer 310, the third insulating layer 210, and the fourth insulating layer 230. The spacer 260 is in contact with the third insulating layer 210 and the fourth insulating layer 230 at least at the upper end. The upper surface of the spacer 260 is in contact with the bit line BL. The spacer 260 has a width substantially the same as that of the upper electrode layer 170 of the memory cell MC1 in the X direction and is adjacent to the upper electrode layer 170 of the memory cell MC1 in the Y direction via the third insulating layer 210.

In FIG. 22C, the cross section of the spacer 260 in the XZ plane is shown in a tapered shape that tapers downward. However, without being limited thereto, the spacer 260 may be in contact with the third insulating layer 210, the fourth insulating layer 230, and the bit line BL at the upper end. The cross section of the spacer 260 in the XZ plane may be, for example, a rectangle, a semicircle, or an inverted triangle. The spacer 260 may be made of an insulator such as silicon nitride (SiN) or silicon oxide (SiO). The maximum thickness of the spacer 260 in the Y direction may be, for example, about 2 nm.

In the semiconductor storage device 1 according to the present embodiment, by arranging the spacer 260 at the upper end of the fourth insulator 220, it is possible to prevent the third insulating layer 210 and the fourth insulating layer 230 from being twisted (bent) and the fourth insulator 220 can be held.

The method for manufacturing the semiconductor storage device according to the present embodiment is omitted here because the semiconductor storage device 1 having the configurations shown in FIGS. 22A to 22C can be manufactured by forming an insulating film to partially bury the upper end of the fourth insulator 220 after the step of removing the second sacrifice layer 240 (FIG. 11) in the first embodiment and removing the insulating film by chemical mechanical polishing (CMP) or the like so that the upper electrode layer 170 on the stacked structure is exposed.

In the method for manufacturing the semiconductor storage device 1 according to the present embodiment, by forming the spacer 260 between the third insulating layer 210 and the fourth insulating layer 230 after the step of removing the second sacrifice layer 240 (FIG. 11) in the first embodiment, it is possible to prevent the third insulating layer 210 and the fourth insulating layer 230 from being twisted (bent) in the step of dividing (2nd cut) the stacked structure (FIG. 15).

Modification 2

The configuration of a semiconductor storage device according to Modification 2 of the present disclosure will be described with reference to FIGS. 23A and 23B. FIGS. 23A and 23B are diagrams showing the configuration of the memory cell (semiconductor element) MC1 of the semiconductor storage device 1 according to this modification. FIG. 23A shows an example of a top view of the memory cell MC1 in the XY plane. FIG. 23B shows another example of the top view of the memory cell MC1 in the XY plane. In FIGS. 23A and 23B, one memory cell MC1 is shown but the memory cell MC1 is connected to the memory cells MC1 having the same configurations in the XY plane to form the memory mat MM0. Similarly, in the Z direction, the memory cell MC1 is connected to the memory cells MC2 having the same configurations by sharing the bit line BL to form the memory mat MM1.

Since the semiconductor storage device according to the present modification is the same as the semiconductor storage device according to the first embodiment except for the sizes and shapes of the insulating layer, the heat-insulating layer, and the insulator, the description of the common parts will be omitted.

As shown in FIG. 23A, the memory cell MC1 includes the word line (first wiring) WL1 extending in the X direction (first direction) disposed on the semiconductor substrate SB side, the bit line (second wiring) BL extending in the Y direction (second direction) arranged opposite to the semiconductor substrate SB with respect to the word line WL1, the memory cell (semiconductor element) MC1 disposed between these word line WL1 and bit line BL, the insulator disposed between the side surfaces of a plurality of memory cells MC1, the heat-insulating layer disposed between the insulator and the memory cell MC1, and the insulating layer surrounding the heat-insulating layer.

The insulator is disposed between the adjacent memory cells MC1. The insulator includes a first insulator 350a adjacent to the memory cell MC1 in the X direction and a third insulator 250a adjacent to the memory cell MC1 in the Y direction. The first insulator 350a extends in the Y direction and is adjacent, in the X direction, to a plurality of memory cells MC1 arranged in the Y direction. The third insulator 250a has a width substantially the same as that of the memory cell MC1 in the X direction and is adjacent to each memory cell MC1 in the Y direction.

The heat-insulating layer is disposed between the memory cell MC1 and the insulator. The heat-insulating layer includes a second insulator 320a disposed between the memory cell MC1 and the first insulator 350a, and a fourth insulator 220a disposed between the memory cell MC1 and the third insulator 250a.

The second insulator 320a extends in the Y direction and is adjacent, in the X direction, to a plurality of memory cells MC1 arranged in the Y direction. The fourth insulator 220a has a width smaller than that of the memory cell MC1 in the X direction and is adjacent to each memory cell MC1 in the Y direction. Here, the second insulator 320a and the fourth insulator 220a surround the side surface of the memory cell MC1. Therefore, the second insulator 320a is recessed in the direction toward the fourth insulator 220a by the amount that the width of the fourth insulator 220a is shortened.

The insulating layer surrounds the heat-insulating layer. The insulating layer includes a first insulating layer 310a, a second insulating layer 330a, a third insulating layer 210a, and a fourth insulating layer 230a. The third insulating layer 210a is disposed between the memory cell MC1 and the fourth insulator 220a. The fourth insulating layer 230a is disposed between the third insulator 250a and the fourth insulator 220a. The third insulating layer 210a has a width smaller than that of the memory cell MC1 and is in contact with the memory cell MC1 and the fourth insulator 220a. The fourth insulating layer 230a has a width smaller than that of the memory cell MC1 and is in contact with the third insulator 250a and the fourth insulator 220a.

The first insulating layer 310a is disposed between the memory cell MC1 and the second insulator 320a. The second insulating layer 330a is disposed between the first insulator 350a and the second insulator 320a. The first insulating layer 310a extends in the Y direction and is in contact with a plurality of memory cells MC1, third insulating layers 210a, fourth insulators 220a, fourth insulating layers 230a, and third insulators 250a, which are arranged in the Y direction. The widths of the third insulating layer 210a, the fourth insulator 220a, and the fourth insulating layer 230a are smaller than the widths of the memory cell MC1 and the third insulator 250a. Therefore, the first insulating layer 310a is recessed in the direction toward the third insulating layer 210a, the fourth insulator 220a, and the fourth insulating layer 230a by the amount that the widths of the third insulating layer 210a, the fourth insulating layer 220a, and the fourth insulating layer 230a are shortened.

The first insulating layer 310a extends in the Y direction and is in contact with the second insulator 320a. The second insulating layer 330a extends in the Y direction and is in contact with the second insulator 320a. The second insulating layer 330a is in contact with the first insulator 350a on the side opposite to the second insulator 320a. Therefore, the second insulator 320a, the second insulating layer 330a, and the first insulator 350a are also recessed in the direction toward the third insulating layer 210a, the fourth insulator 220a, and the fourth insulating layer 230a by the amount that the widths of the third insulating layer 210a, the fourth insulator 220a, and the fourth insulating layer 230a are shortened. That is, the side surface of the memory cell MC1 is surrounded by the first insulating layer 310 and the third insulating layer 210. The bottom surface and the side surface of the third insulator 250 are surrounded by the first insulating layer 310 and the fourth insulating layer 230. The bottom surface and the side surface of the fourth insulator 220 are surrounded by the first insulating layer 310, the third insulating layer 210, and the fourth insulating layer 230.

In the modification in FIG. 23B, the width of the third insulator 250b is smaller than that of the memory cell MC1. The insulator is disposed between adjacent memory cells MC1. The insulator includes a first insulator 350b adjacent to the memory cell MC1 in the X direction and a third insulator 250b adjacent to the memory cell MC1 in the Y direction. The first insulator 350b extends in the Y direction and is adjacent, in the X direction, to a plurality of memory cells MC1 arranged in the Y direction. The third insulator 250b has a width smaller than that of the memory cell MC1 in the X direction and is adjacent to each memory cell MC1 in the Y direction.

The heat-insulating layer is disposed between the memory cell MC1 and the insulator. The heat-insulating layer includes a second insulator 320b disposed between the memory cell MC1 and the first insulator 350b, and a fourth insulator 220b disposed between the memory cell MC1 and the third insulator 250b.

The second insulator 320b extends in the Y direction and is adjacent, in the X direction, to a plurality of memory cells MC1 arranged in the Y direction. The fourth insulator 220b has a width smaller than that of the memory cell MC1 in the X direction and is adjacent to each memory cell MC1 in the Y direction. Here, the second insulator 320b and the fourth insulator 220b surround the side surface of the memory cell MC1. Therefore, the second insulator 320b is recessed in the direction toward the fourth insulator 220b by the amount that the width of the fourth insulator 220b is shortened.

The insulating layer surrounds the heat-insulating layer. The insulating layer includes a first insulating layer 310b, a second insulating layer 330b, a third insulating layer 210b, and a fourth insulating layer 230b. The third insulating layer 210b is disposed between the memory cell MC1 and the fourth insulator 220b. The fourth insulating layer 230b is disposed between the third insulator 250b and the fourth insulator 220b. The third insulating layer 210b has a width smaller than that of the memory cell MC1 and is in contact with the memory cell MC1 and the fourth insulator 220b. The fourth insulating layer 230b has a width smaller than that of the memory cell MC1 and is in contact with the third insulator 250b and the fourth insulator 220b.

The first insulating layer 310b is disposed between the memory cell MC1 and the second insulator 320b. The second insulating layer 330b is disposed between the first insulator 350b and the second insulator 320b. The first insulating layer 310b extends in the Y direction and is in contact with a plurality of memory cells MC1, third insulating layers 210b, fourth insulators 220b, fourth insulating layers 230b, and third insulators 250b, which are arranged in the Y direction. The widths of the third insulating layer 210b, the fourth insulator 220b, the fourth insulating layer 230b, and the third insulator 250b are smaller than the width of the memory cell MC1. Therefore, the first insulating layer 310b is recessed in the direction toward the third insulating layer 210b, the fourth insulator 220b, the fourth insulating layer 230b, and the third insulator 250b by the amount that the widths of the third insulating layer 210b, the fourth insulator 220b, the fourth insulating layer 230b, and the third insulator 250b are shortened.

The second insulator 320b extends in the Y direction and is in contact with the first insulating layer 310b. The second insulating layer 330b extends in the Y direction and is in contact with the second insulator 320b. The second insulating layer 330b is in contact with the first insulator 350b on the side opposite to the second insulator 320b. Therefore, the second insulator 320b, the second insulating layer 330b, and the first insulator 350b are also recessed in the direction toward the third insulating layer 210b, the fourth insulator 220b, the fourth insulating layer 230b, and the third insulator 250b by the amount that the widths of the third insulating layer 210b, the fourth insulator 220b, the fourth insulating layer 230b, and the third insulator 250b are shortened. That is, the side surface of the memory cell MC1 is surrounded by the first insulating layer 310b and the third insulating layer 210b. The bottom surface and the side surface of the third insulator 250b are surrounded by the first insulating layer 310b and the fourth insulating layer 230b. The bottom surface and the side surface of the fourth insulator 220b are surrounded by the first insulating layer 310b, the third insulating layer 210b, and the fourth insulating layer 230b.

The manufacturing method of the semiconductor storage device according to the present modification is omitted here because the semiconductor storage device 1 having the configurations shown in FIGS. 23A and 23B can be manufactured by appropriately adjusting the etching conditions in the step of dividing (2nd cut) the stacked structure (FIG. 15).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor storage device comprising:
a first wiring extending in a first direction;
a second wiring extending in a second direction intersecting the first direction;
a first semiconductor device extending in a third direction intersecting the first direction and the second direction, connected to the first wiring and the second wiring, and including a first selector layer and a first variable resistance layer;
a first insulator extending in the second and third directions and adjacent to the first semiconductor device in the first direction;
a second insulator extending in the second and third directions and including an air gap disposed between the first semiconductor device and the first insulator;
a first insulating layer extending in the second and third directions and being in contact between the first semiconductor device and the second insulator; and
a second insulating layer extending the second and third directions and being in contact between the first insulator and the second insulator.
2. The semiconductor storage device according to claim 1, wherein the second insulator is at least provided at a same position as the first variable resistance layer in the third direction.

3. The semiconductor storage device according to claim 1, wherein
the second insulator further includes an amorphous silicon layer or a silicon nitride layer at a same position as the first selector layer in the third direction.

4. The semiconductor storage device according to claim 1, wherein
the second insulator is a heat-insulating layer.

5. The semiconductor storage device according to claim 1, further comprising:
a third insulator extending in the third direction, adjacent to the first semiconductor device in the second direction, and being in contact with the first insulating layer; and
a fourth insulator extending in the third direction and including an air gap being in contact with the first insulating layer between the first semiconductor device and the third insulator.

6. The semiconductor storage device according to claim 5, wherein
the fourth insulator is at least provided at a same position as the first variable resistance layer in the third direction.

7. The semiconductor storage device according to claim 5, wherein
the fourth insulator further includes an amorphous silicon layer or a silicon nitride layer at a same position as the first selector layer in the third direction.

8. The semiconductor storage device according to claim 5, further comprising:
a third insulating layer extending in the third direction, being in contact between the first semiconductor device and the fourth insulator, and connected to the first insulating layer; and
a fourth insulating layer extending in the third direction, being in contact between the third insulator and the fourth insulator, and connected to the first insulating layer.

9. The semiconductor storage device according to claim 8, further comprising:
a third wiring extending in the first direction and adjacent to the first wiring in the second direction via the third insulator;
a second semiconductor device extending in the third direction, connected to the third wiring and the second wiring, being in contact with the first insulator, and including a second selector layer and a second variable resistance layer; and
a fifth insulator extending in the third direction and including an air gap disposed between the second semiconductor device and the third insulator.

10. The semiconductor storage device according to claim 9, wherein
the fifth insulator is provided at a same position as the second variable resistance layer in the third direction.

11. The semiconductor storage device according to claim 9, wherein
the fifth insulator further includes an amorphous silicon layer or a silicon nitride layer at a same position as the second selector layer in the third direction.

12. The semiconductor storage device according to claim 9, further comprising:
a fifth insulating layer extending in the third direction, being in contact between the second semiconductor device and the fifth insulator, and connected to the first insulating layer; and
a sixth insulating layer extending in the third direction, being in contact between the third insulator and the fifth insulator, and connected to the first insulating layer.

\* \* \* \* \*